US008102260B2

(12) United States Patent
Kotter et al.

(10) Patent No.: US 8,102,260 B2
(45) Date of Patent: Jan. 24, 2012

(54) METHODS, SYSTEMS AND DEVICES FOR DETECTING THREATENING OBJECTS AND FOR CLASSIFYING MAGNETIC DATA

(75) Inventors: Dale K. Kotter, Shelley, ID (US); Lyle G. Roybal, Idaho Falls, ID (US); David T. Rohrbaugh, Idaho Falls, ID (US); David F. Spencer, Idaho Falls, ID (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 325 days.

(21) Appl. No.: 11/687,725

(22) Filed: Mar. 19, 2007

(65) Prior Publication Data

US 2008/0231443 A1 Sep. 25, 2008

(51) Int. Cl.

*G08B 13/24* (2006.01)
*G01R 33/00* (2006.01)
*G01D 1/00* (2006.01)
*G06F 15/00* (2006.01)
*G06M 11/04* (2006.01)

(52) U.S. Cl. .......................... 340/551; 324/260; 702/127

(58) Field of Classification Search .................. 340/551, 340/572.17; 720/127

See application file for complete search history.

(56) References Cited

U.S. PATENT DOCUMENTS

| | | | | |
|---|---|---|---|---|
| 5,801,631 | A * | 9/1998 | Hayashi | 340/572.5 |
| 6,150,810 | A * | 11/2000 | Roybal | 324/244 |
| 6,269,324 | B1 * | 7/2001 | Rakijas et al. | 702/190 |
| 6,469,624 | B1 * | 10/2002 | Whan et al. | 340/551 |
| 7,312,752 | B2 * | 12/2007 | Smith et al. | 342/464 |
| 2003/0167139 | A1 * | 9/2003 | Swartz et al. | 702/65 |
| 2003/0174057 | A1 * | 9/2003 | Kim et al. | 340/541 |
| 2004/0021778 | A1 * | 2/2004 | Oldani et al. | 348/211.99 |
| 2004/0234132 | A1 * | 11/2004 | Jojic et al. | 382/197 |
| 2005/0182590 | A1 * | 8/2005 | Kotter et al. | 702/127 |
| 2005/0242817 | A1 * | 11/2005 | Hoult | 324/326 |
| 2006/0140340 | A1 * | 6/2006 | Kravis | 378/57 |
| 2007/0013372 | A1 * | 1/2007 | Murray et al. | 324/244 |
| 2008/0136631 | A1 * | 6/2008 | Fluck | 340/551 |
| 2009/0121888 | A1 * | 5/2009 | Reeves et al. | 340/669 |

FOREIGN PATENT DOCUMENTS

WO WO 2006/036752 6/2006

OTHER PUBLICATIONS

HIBBS, Passive Magnetic Detection system for Security Screening, Sep. 22, 2004, WIPO.*

PCT International Search Report and Written Opinion of the International Searching Authority, International Application No. PCT/US07/85342, International Filing Date Nov. 21, 2007.

* cited by examiner

*Primary Examiner* — Benjamin C Lee
*Assistant Examiner* — Cal Eustaquio
(74) *Attorney, Agent, or Firm* — TraskBritt

(57) ABSTRACT

A method for detecting threatening objects in a security screening system. The method includes a step of classifying unique features of magnetic data as representing a threatening object. Another step includes acquiring magnetic data. Another step includes determining if the acquired magnetic data comprises a unique feature.

24 Claims, 17 Drawing Sheets

METHODS, SYSTEMS AND DEVICES FOR DETECTING THREATENING OBJECTS AND FOR CLASSIFYING MAGNETIC DATA

GOVERNMENT RIGHTS

This invention was made with Government support under Contract DE-AC07-05-ID14517 awarded by the U.S. Department of Energy. The Government has certain rights in the invention.

TECHNICAL FIELD

The invention relates to methods, systems and devices for detecting threatening objects passing through a security screening system.

BACKGROUND OF THE INVENTION

The goal of detecting and locating threatening objects or items such as weapons has increased in importance as society becomes more violent. In response to this goal, security screening systems have become more prevalent and are being used in facilities and places where the need for screening was previously not considered necessary. To increase safety while keeping public inconvenience at a minimum, the focus of the security screening industry is to increase the accuracy of distinguishing between threatening and non-threatening objects while maintaining a high throughput.

Exemplary security screening systems (also referred to as "system(s)") are configured to rely on passive magnetic sensors or magnetometers to detect threatening objects. Such configurations of security screening systems depend on the unvarying and uniformity of the Earth's magnetic field to operate effectively. That is, passive magnetic sensors (also referred to as "sensor(s)") define a sensing region that extends into a portal passageway of the systems for detecting disturbances or variances in the uniformity of the magnetic field of the Earth. The variances in the magnetic field are called gradients. Exemplary weapons and/or threatening objects are routinely formed from ferrous or ferromagnetic material (iron). As ferrous or ferromagnetic material passes through a portal passageway, the Earth's magnetic field is disturbed or varied and is registered by the passive sensors. That is, the sensors detect this change or variance in the Earth's magnetic field as a gradient and output a response that is configured as a voltage signal. The security screening system interprets the gradient (voltage signal) as the detection of a ferrous object. In this manner, the security screening system indicates the presence of a potential weapon(s) within the portal passageway of the system.

However, the Earth's magnetic field varies slowly, and randomly, over a period of time that interrupts the operation of security screening systems based on passive sensor configurations. For example, the periodic rising and setting of the Sun causes diurnal variations to the Earth's magnetic field. Additionally, unpredictable solar flares and magnetic storms produced by the Sun randomly impact and vary the uniformity of the Earth's magnetic field. These influences are referred to as "far-field disturbances." Furthermore, "local disturbances" can influence and vary the uniformity of the Earth's magnetic field. Exemplary local disturbances include man-made objects such as wheelchairs and cars, and even larger ferromagnetic objects such as airport subways.

Security screening systems are designed to compensate for these far-field and local disturbances. However, baseline responses produced by the sensors of the systems tend to wander over a period of time as result of these far-field and local disturbances. Additionally, electronic noise and instability inherent in the sensors combine with the far-field and local disturbances to compound the detrimental effects on operational capabilities of security screening systems.

Accordingly, there is a need to provide data analysis methods and detection/location methods for security screening systems to compensate for far-field disturbances, local disturbances, electronic noise, and instability inherent in the sensors. Moreover, there is a need to improve the signal-to-noise ratio of the magnetic sensors with data analysis methods and detection/location methods that compensate for DC drift and single-point response spikes, which are induced or outputted by magnetic sensors of security screening systems.

SUMMARY OF THE INVENTION

Some aspects of the invention provide methods for detecting threatening objects. One exemplary detecting method comprises the step of classifying unique features of magnetic data as representing a threatening object. Another step comprises acquiring magnetic data. Still another step comprises determining if the acquired magnetic data comprises a unique feature.

Another aspect of the invention comprises an exemplary security screening system. The system includes a portal structure defining a passageway. The system further includes an array of magnetic sensors arranged in the portal structure and configured to output magnetic data. The system includes a camera positioned to photograph the passageway. The system includes a processor coupled to each magnetic sensor.

Still another aspect of the invention includes a method for classifying magnetic signature data as representing specific objects. An exemplary classifying method comprises the step of simulating security screening scenarios by passing objects through a security screening system. Another step includes collecting magnetic signature data that is representative of the objects. Still another step comprises extracting features from the magnetic signature data that distinguish respective objects. Still further, another step comprises performing a pre-classification optimization method on the features.

BRIEF DESCRIPTION OF THE DRAWINGS

Preferred embodiments of the invention are described below with reference to the following accompanying drawings.

FIG. 14 illustrates an exemplary block diagram representing the interdependency of the various embodiments of classification analysis methods that culminate in a classification result for an exemplary embodiment of a pattern classification method according to one of various embodiments of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
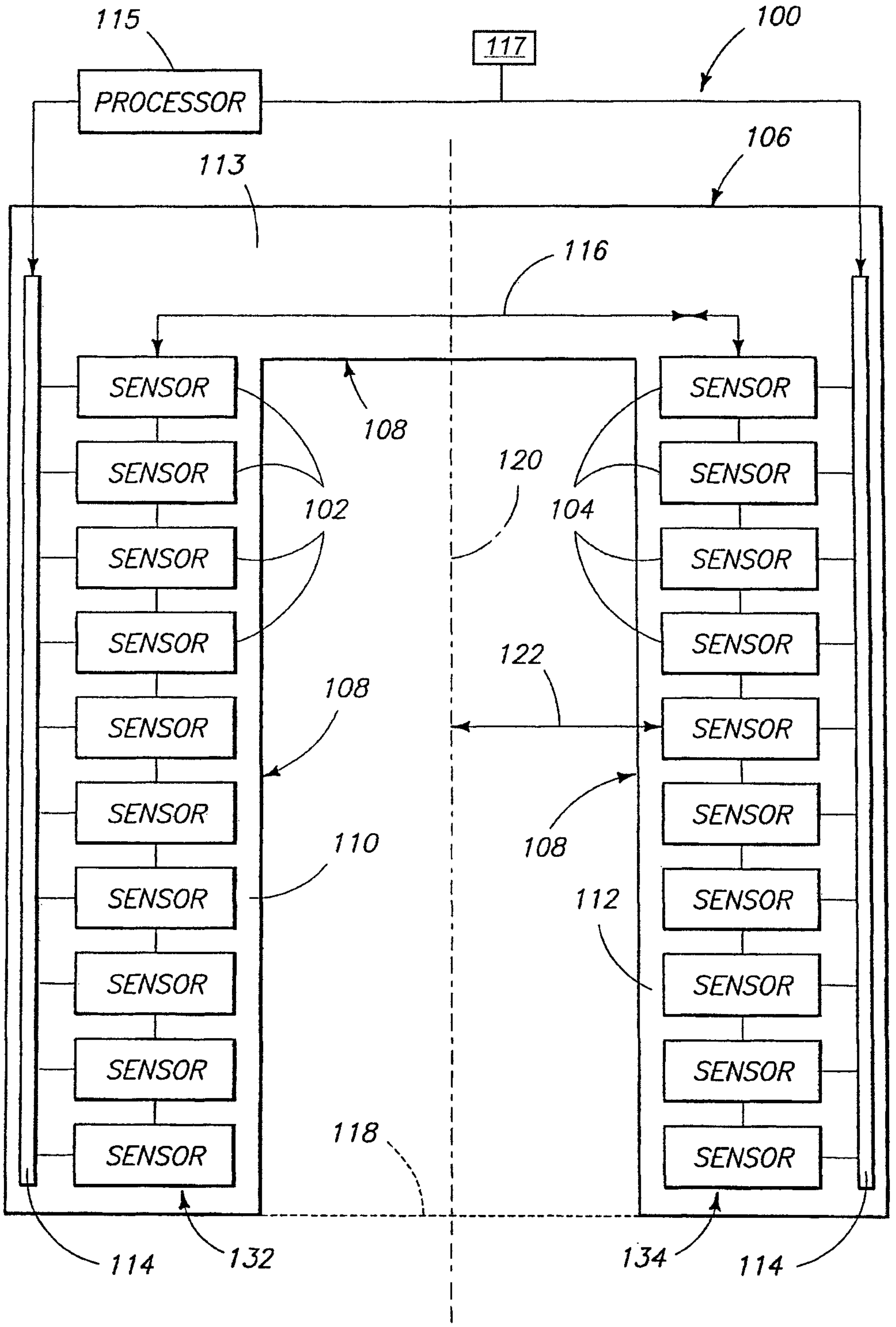
FIG. 1 is a front elevational view of an exemplary portal passageway of an exemplary security screening system according to one of various embodiments of the invention.

Referring to FIG. 1, an exemplary portal passageway for an exemplary security screening system 100 (hereinafter also referred to as "system 100") is described. The security screening system 100 comprises an exemplary portal structure or frame 106 having opposite vertical portions (or columns) 110 and 112 extending upward from a ground or floor level 118, as shown by dashed lines. Vertical portion 110 of the exemplary portal frame 106 houses an array 132 of magnetic sensors 102 oriented vertically (only four magnetic sensors 102 are referenced with a number). Vertical portion 112 of the exemplary portal frame 106 houses an array 134 of magnetic sensors 104 oriented vertically (only four magnetic sensors 104 are referenced with a number). In one of various embodiments of the invention, each array 132 and 134 comprises ten magnetic sensors 102 and 104, respectively. However, for other embodiments of the invention, each array comprises less than ten magnetic sensors or more than ten magnetic sensors. Additionally, in one of various embodiments of the invention, each array 132 and 134 comprises the same number of magnetic sensors, and in other embodiments, each array 132 and 134 comprises different numbers of magnetic sensors relative to each other.

Still referring to FIG. 1, each magnetic sensor 102 of array 132 is positioned a vertical distance or height relative the ground level 118 and is aligned with at least one corresponding magnetic sensor 104 in array 134, which is located at the same vertical distance or position relative the ground level 118. For example, each magnetic sensor 102 of array 132 has a corresponding magnetic sensor 104 of array 134 that is elevationally the same height or distance from ground level 118, that is, in the same horizontal plane. In other embodiments of the invention, at least one magnetic sensor in one array is positioned a vertical distance that is staggered relative the vertical distance or position of any one of the other magnetic sensors in the opposite column. That is, in this other embodiment, the at least one magnetic sensor is not in the same horizontal plane with any one of the other magnetic sensors.

Still referring to FIG. 1, a passageway or gateway 108 (doorway or aperture or portal passageway) is defined by portal frame 106, and more specifically, defined by inner walls of respective vertical portions 110 and 112 and an inner wall of a horizontally extending portion 113 of portal frame 106. Passageway 108 defines an entrance, opposite an exit, configured for allowing items and/or persons to pass through the security screening system 100 for inspection. A center of passageway 108 defined horizontally between respective sensors is represented by center line 120 extending vertically. An exemplary horizontal distance between the center line 120 and any one magnetic sensor 102, 104 is represented by distance line 122. Various exemplary portal structures are described and disclosed in U.S. Pat. No. 6,150,810, the entire disclosure of which is incorporated herein by reference.

Still referring to FIG. 1, each magnetic sensor 102 and 104 comprises a scanning region for sensing or measuring a gradient in the ambient magnetic field and outputs magnetic data (output or response signal) representative of the gradient. For example, in an embodiment of the invention, each magnetic sensor 102 and 104 is a passive sensor that measures the gradient in the ambient magnetic field produced by the Earth. Collectively, the scanning regions of respective magnetic sensors 102 and 104 define or form a sensing or screening region of system 100 that extends within the passageway 108. In one of the various embodiments of the invention, the screening region of system 100 will encompass an entirety of the passageway 108. In other embodiments of the invention, the screening region of system 100 will encompass less than an entirety of the passageway 108 of system 100.

Still referring to FIG. 1, exemplary magnetic sensors or magnetometers 102 and 104 include magnetic sensor boards and gradiometers according to various embodiments of the invention. Moreover, exemplary electrical power is provided from an exemplary facility, such as an airport (not shown), to magnetic sensors 102 and 104 via power bus 114. Magnetic sensors 102 and 104 in respective opposite vertical portions 110 and 112 of portal frame 106 are coupled separately and discretely to a processor 115 or microprocessor via a power bus 114. An exemplary processor is a digital signal processor (DSP) 115. The separate and discrete circuitry allows for separate and distinct signals which are specifically tailored for and provided to the respective magnetic sensors 102 and 104. Additionally, magnetic sensors 102 and 104 in respective opposite vertical portions 110 and 112 of portal frame 106 are interconnected 116 via a combination of hubs and power supplies (not shown). It should be understood that according to exemplary embodiments of the invention, the array of magnetic sensors 102 and 104 can have a plurality of arrangements and configurations to further define the screening region of system 100. For example, magnetic sensors 102 and 104 can be provided in a horizontally extending portion 113 of portal frame 106 to extend generally in a horizontal orientation, and/or in floor portions that support the portal frame 106 to extend generally in a horizontal orientation.

Moreover, in some embodiments, system 100 can optionally include one or more trigger devices 117 that signal when a person or object is approaching the entrance and leaving the exit of passageway 108 of portal frame 106. Activating trigger device 117 prompts system 100 to initiate a screening or measurement event and obtain magnetic data of the person or object passing through system 100. Alternatively, system 100 can be prompted by other methods and means. For example, a person operating system 100 can manually initiate a screening or measurement event and obtain magnetic data.

Figure 2:
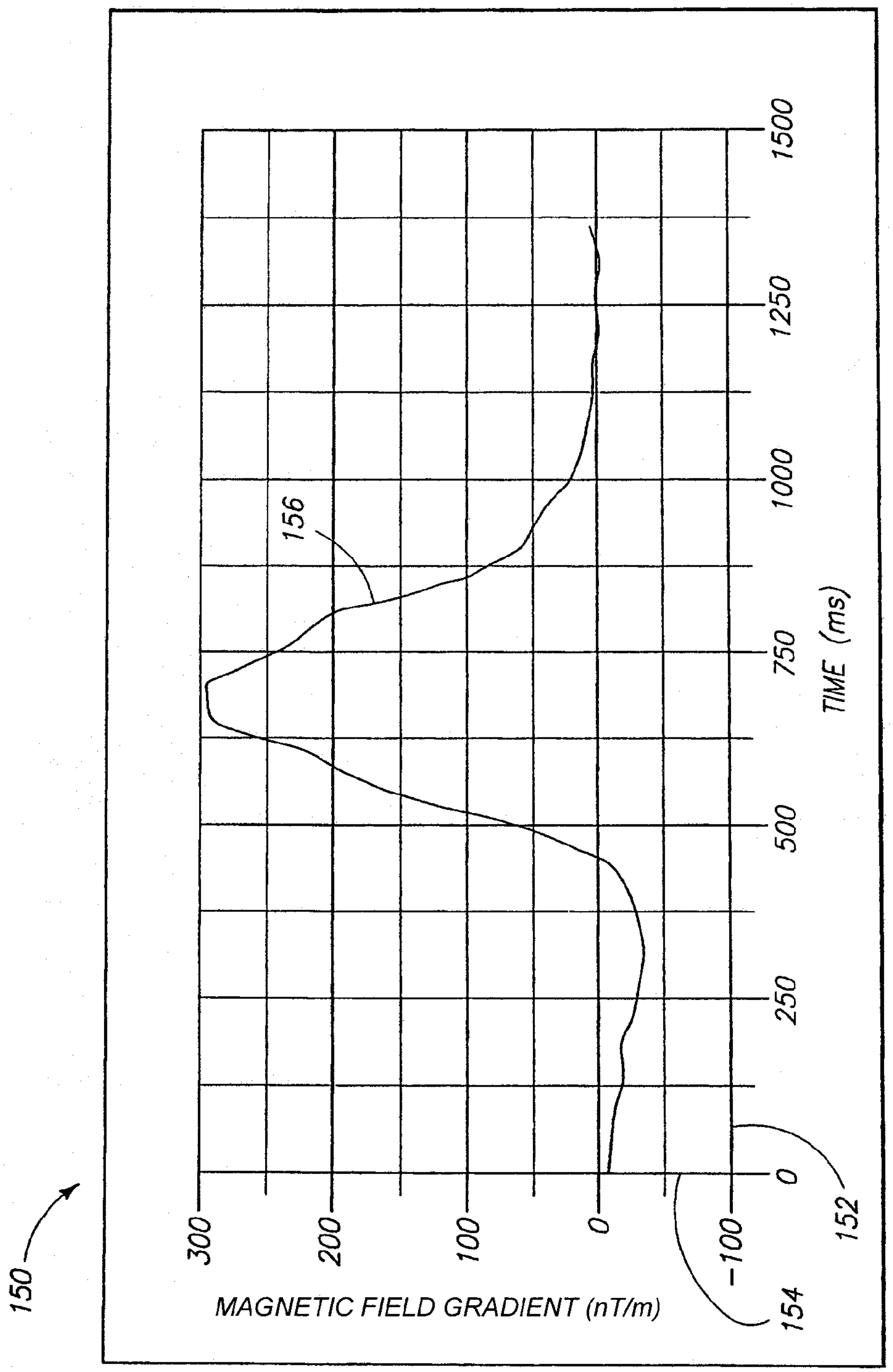
FIG. 2 is a graphical representation of magnetic data obtained from a magnetic sensor according to one of various embodiments of the exemplary security screening system of FIG. 1 during an exemplary measuring event with an exemplary ferrous object passing through the portal passageway.

Referring to FIG. 2, an exemplary graphical representation 150 is illustrated according to one of various embodiments of the invention representing magnetic data outputted or registered by a single magnetic sensor. The magnetic data represents a ferrous or ferromagnetic object being sensed or measured by the single magnetic sensor as the ferrous object passes by the sensor through the passageway 108 of system 100 (FIG. 1). The graphical representation 150 shows a response or output curve 156 illustrating magnetic field gradients resulting from the presence of the ferrous object and sensed by the single magnetic sensor over a duration or period of time. Accordingly, response curve 156 is a two-dimensional plot having a vertical axis 154 representing values for magnetic field gradients (in units of nanoTeslalmeter) and a horizontal axis 152 representing values for specific points in the period of time (in units of milliseconds). The exemplary single magnetic sensor can be characterized as a first magnetic sensor for the purpose of distinguishing the first magnetic sensor relative other sensors to be discussed subsequently.

It should be understood that as the ferrous object passes within the scanning region of the first magnetic sensor (and sensing or screening region of system 100). The first magnetic sensor senses, measures, outputs and/or registers the gradient or change in the orientation of the Earth's magnetic field. The sensed gradient is outputted as a magnetic signal or response, collectively over the period of time termed magnetic data, and illustrated as response curve 156 of FIG. 2. Correspondingly, since respective scanning regions of each magnetic sensor collectively represent a sensing or screening region of system 100, the gradient induced by the ferrous object can be registered or outputted by other sensors of system 100 during the same measuring or sensing event. However, it should be understood that the shape of the response curve representing the magnetic data of the other sensors depends on the distance relative the ferrous object and the other sensor. That is, respective differences in distances from respective sensors to the ferrous object influence the shape of the respective curves because the strength or magnitude of the magnetic field gradients being registered by the respective magnetic sensor are different. Accordingly, the shape of each curve representing the magnetic data for each magnetic sensor is influenced by the distances between the ferrous object and the respective magnetic sensors.

For example, still referring to FIG. 2, the large variation in response curve 156 over the period of time is a strong indication that the ferrous object exists in system 100 and has passed within the scanning region of the single magnetic sensor. Moreover, it should be understood that each magnetic sensor 102 and 104 of system 100 may provide magnetic data of the same sensing or measurement event produced by the same ferrous object passing through system 100. Of course, as stated previously, each curve representing magnetic data of each magnetic sensor of system 100 will vary depending on the distances between the ferrous object and respective magnetic sensor of system 100.

Figure 3:
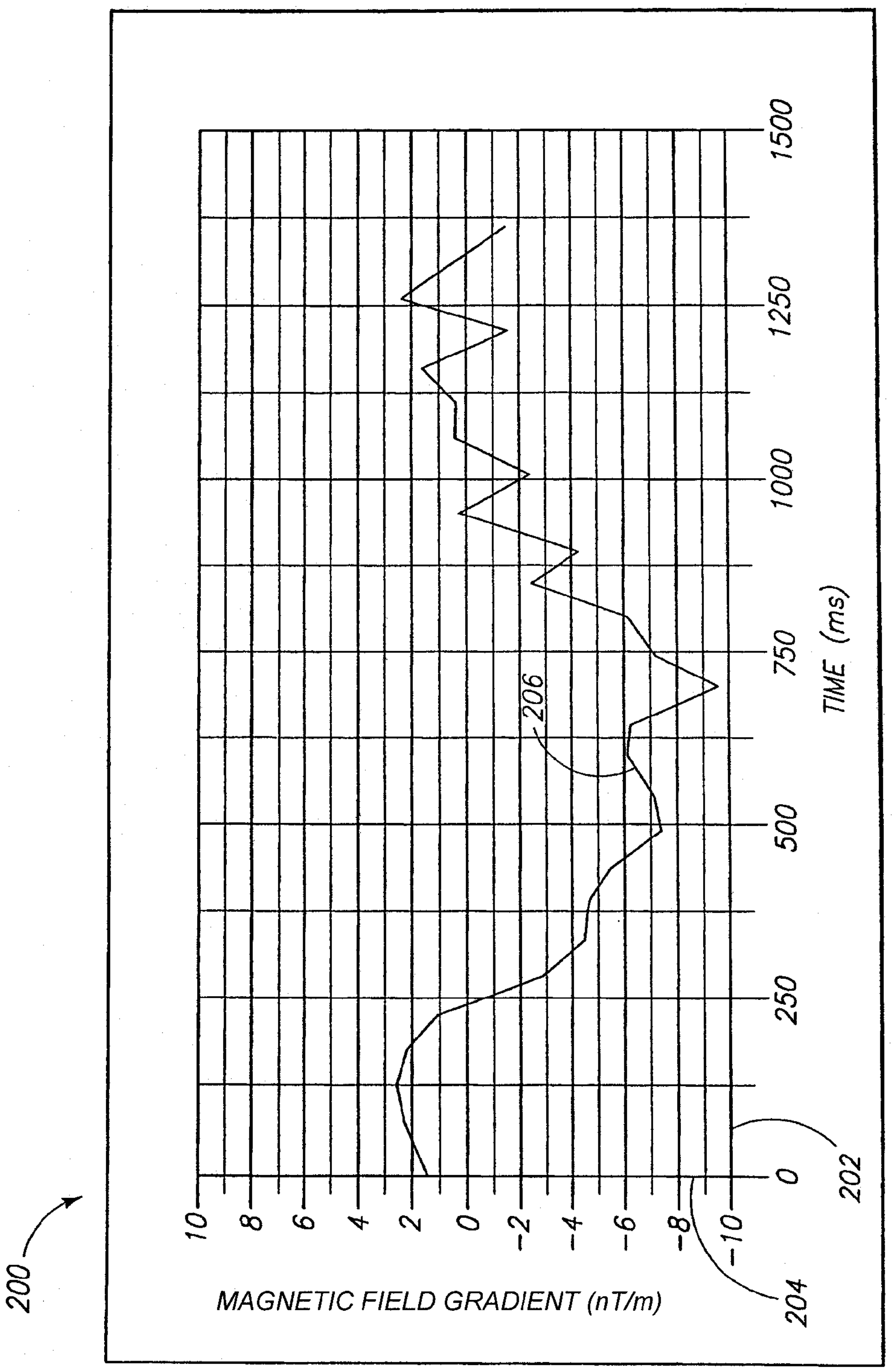
FIG. 3 is a graphical representation of magnetic data obtained from another magnetic sensor of the FIG. 1 security screening system during the same measuring event of FIG. 2, wherein the another magnetic sensor is positioned at a greater distance from the passing ferrous object.

For example, referring to FIG. 3, graphical representation 200 illustrates the same sensing or measuring (measurement) event for the same ferrous object passing through system 100 as illustrated in FIG. 2. However, FIG. 3 illustrates the response or output signal (magnetic data) from another, second magnetic sensor of system 100 that is positioned at a different distance from the ferrous object relative the first magnetic sensor of FIG. 2. Response curve 206 of FIG. 3 is different from response curve 156 of FIG. 2, due to the differences in respective distances from the ferrous object as it passes through system 100. In fact, outputs signals from respective first and second magnetic sensors are so different that respective graphical representations 150 and 200 must use different scales for the values of magnetic field gradients along the respective vertical axes 154 and 204, while time along the respective horizontal axes 152, 202 remain the same. The scale of magnetic field gradients for FIG. 2 is from −100 nT/m to 300 nT/m and the scale of magnetic field gradients for FIG. 3 is from −10 nT/m to 10 nT/m. Accordingly, the scale difference of FIG. 3 is an order of magnitude different from the scale of FIG. 2. If vertical axis 204 of FIG. 3 had the same scale as the vertical axis 154 of FIG. 2, curve 206 of FIG. 3 would be substantially a horizontal straight line and, therefore, would not provide any useful magnetic data information. Moreover, response curve 156 of FIG. 2 clearly indicates the ferrous object is being detected by the first magnetic sensor while response curve 206 of FIG. 3 indicates that background noise and/or inference is detrimentally affecting the output signals (magnetic data) from the second magnetic sensor.

Figure 4:
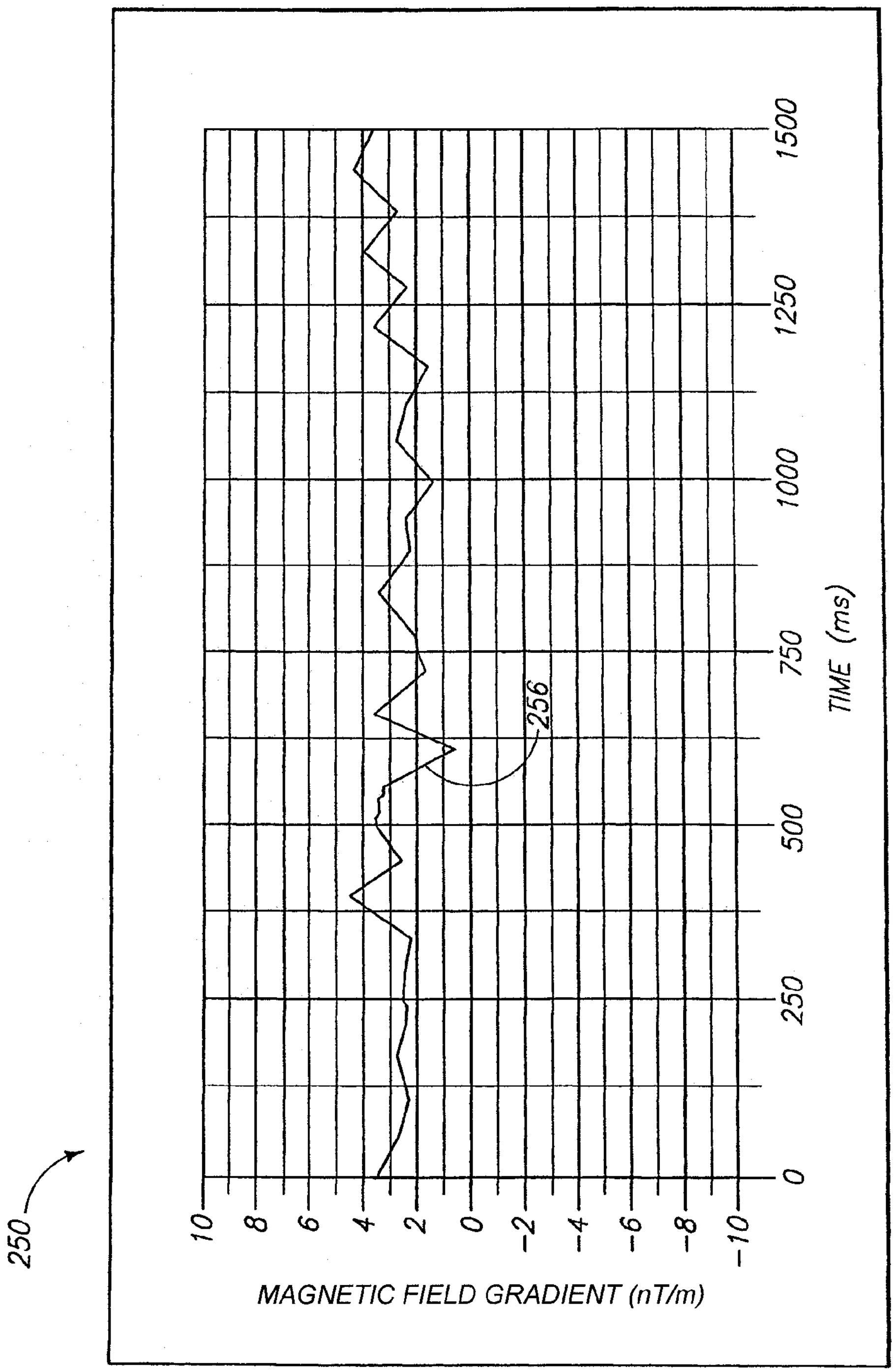
FIG. 4 is a graphical representation of magnetic data obtained from any one of the exemplary magnetic sensors according to one of various embodiments of the security screening system of FIG. 1, wherein no ferrous objects exist in the portal passageway.

Referring to FIG. 4, graphical representation 250 illustrates the magnetic response from security screening system 100 where no ferrous object exists within any one scanning region of any one magnetic sensor 102 and 104. Ideally, the response curve 256 of FIG. 4 would be a horizontal line to clearly indicate no ferrous object is being sensed. However, response curve 256 has undulations that are due to small DC output components from the exemplary magnetic sensor. The small DC output signals occur because the magnetic sensors 102 and 104 are configured to continuously null gradients resulting from environmental factors affecting the ambient magnetic field. Such environmental factors include the far-field and local disturbances discussed previously.

Data analysis methods according to various exemplary embodiments of the invention are described, which negate or null the DC components or offsets caused by the large and small environmental influences on the ambient magnetic field. Additionally, data analysis methods according to various exemplary embodiments of the invention are described to detect and locate ferrous objects passing within the screening region of the security screening system 100. These exemplary data analysis methods comprise detection and location methods that increase the operational capabilities and selectivity of security screening systems.

An exemplary data analysis method according to one of various embodiments of the invention is appropriately termed the "feature extraction method." The feature extraction method is performed on the magnetic data received from the security screening system 100 wherein each magnetic sensor (also referred to as "sensor") detects or senses a gradient, individually. The feature extraction method processes the magnetic data or raw magnetic data (output signals or responses of raw gradient data) from each sensor. In exemplary various embodiments of the feature extraction method, three separate and distinct values are reached: 1) a summary gradient value for each sensor; 2) a total power value of the gradient signal detected by each sensor; and 3) a dimensionless ratio of time value configured as the first instant in the time period window that each sensor detects an object over or relative the entire time period window.

Figure 5:
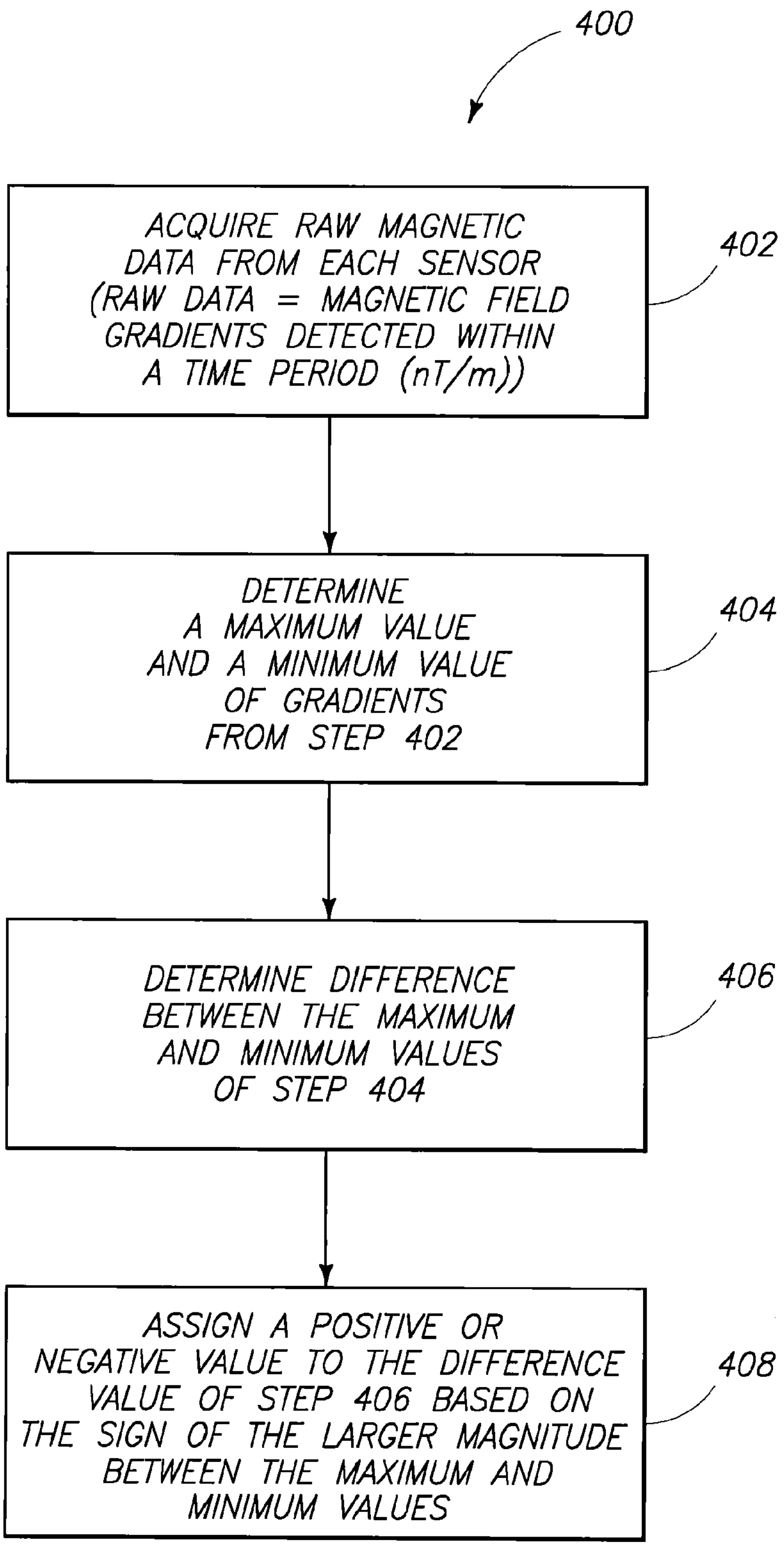
FIG. 5 is an exemplary data analysis method according to one of various embodiments of the present invention.

Referring to FIG. 5, a first step 400 of the feature extraction method is described. The method includes several sub-steps. In sub-step 402 of first step 400, raw magnetic data from each magnetic sensor is acquired and configured the same as presented in FIGS. 2-4. That is, during a measurement event, the raw magnetic data can be configured as response curves of magnetic field gradient values (also referred to as "gradients") being outputted from each sensor and plotted with respect to a period of time. An exemplary span or period of time selected for acquiring the magnetic field gradients includes a period of about 1,500 milliseconds. However, any exemplary period of time can be selected for obtaining the magnetic field gradients and can depend on a specific purpose for gathering the magnetic data, that is, application specific. For ease of discussion, it should be understood that the feature extraction methods are described generally with respect to the output of a single magnetic sensor. In actuality, the feature extraction methods are performed on all magnetic data for each sensor of system 100 substantially at the same time.

Still referring to FIG. 5, sub-step 404 comprises determining a maximum value and a minimum value of the magnetic field gradients within the selected period of time from sub-step 402. Moreover, a determination is made where each of the maximum and minimum values occur in the period of time.

Still referring to FIG. 5, sub-step 406 comprises determining the difference between the maximum and minimum values computed in sub-step 404 and arriving at a summary magnitude value of the magnetic field gradient that is detected by each sensor. That is, a single summary magnitude value is computed to summarize the raw magnetic data configured in sub-step 402 for each sensor.

Still referring to FIG. 5, sub-step 408, assigning a sign (positive (+) or negative (−)) to the summary magnitude value of sub-step 406 based on the sign of the larger magnitude between respective maximum and minimum values.

Figure 6:
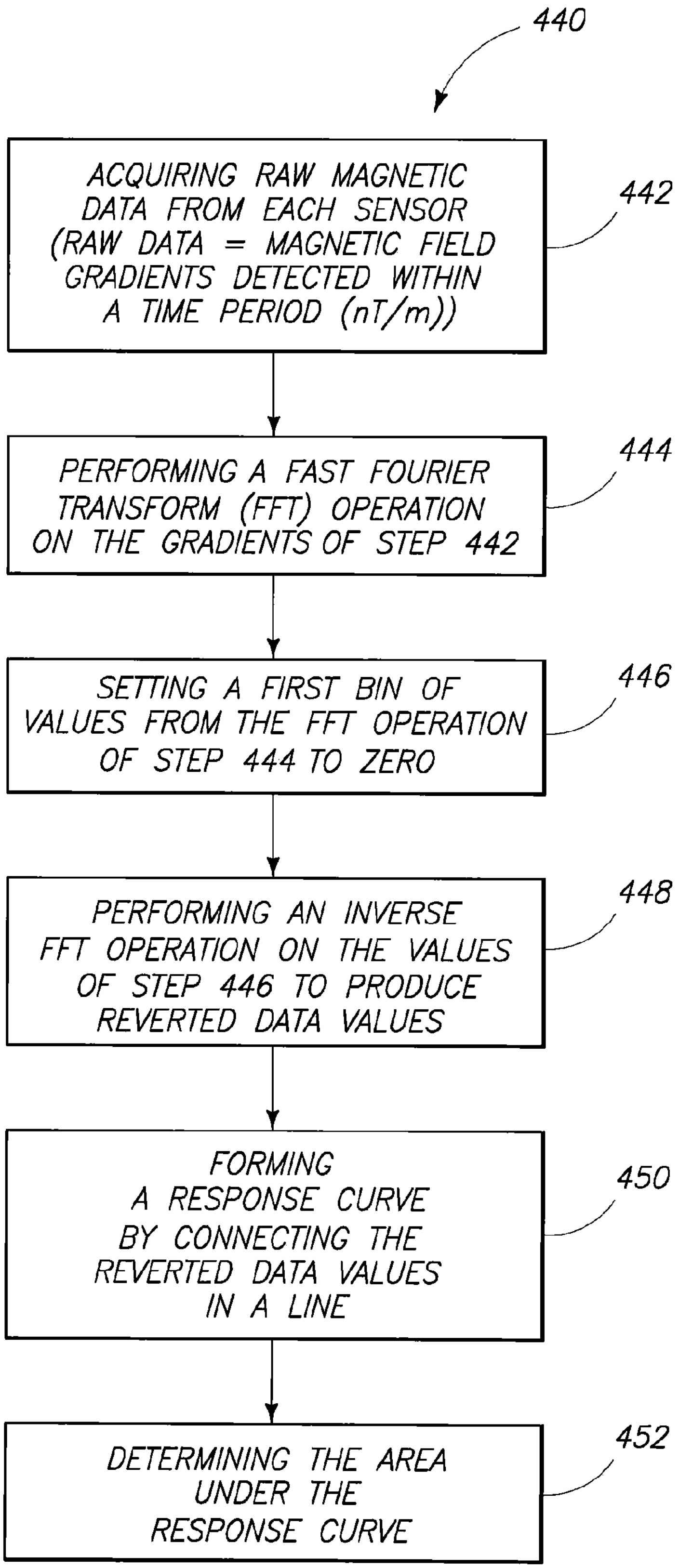
FIG. 6 is an exemplary data analysis method according to one of various embodiments of the present invention.

Referring to FIG. 6, a second step 440 of the feature extraction method is described. For sub-step 442 of the second step 440, again, the output signals or raw magnetic data of each sensor are used and configured into response curves similar to FIGS. 2-4 and sub-step 402 of the first step 400. That is, during a measurement event, the raw magnetic data can be configured as response curves of values for magnetic field gradients being outputted from each sensor and plotted with respect to a period of time.

Still referring to FIG. 6, sub-step 444 of the second step 440 comprises performing a point-by-point Fast Fourier Transform (FFT) on the gradients of the response curve from sub-step 442 for each sensor. The FFT computation provides FFT values for each sensor as a function of frequency (in the frequency domain). The FFT values essentially comprise digital samples or data as a function of frequency wherein the FFT values are characterized as an analog signal. The FFT values comprise sample bins of FFT values which are based on specific numerical values for the frequency variable. For example, a first bin of FFT values can be selected to represent FFT values with the frequency variable equaling zero, that is, the FFT value at the zero frequency. The FFT values at the zero frequency essentially represent the DC offset component or value for the raw magnetic data. The DC offset value represents the mean value of the response curve for the raw magnetic data. Accordingly, alternatively, the DC offset value can be determined by computing the mean value of the response curve for the raw magnetic data.

Still referring to FIG. 6, sub-step 446 of the second step 440 comprises manually setting the first bin of FFT values, which represent the zero frequency, to equal zero. This has the effect of subtracting or eliminating (nulling or negating) the DC offset components or values existing in the magnetic data for respective sensors. Accordingly, the detrimental environmental influences on the magnetic data described previously are, at least partially, negated.

Still referring to FIG. 6, sub-step 448 of the second step 440 comprises, with the first bin of FFT values being set to zero, performing an inverse FFT computation on the FFT values in the frequency domain to convert (or revert) the FFT values back into the time domain (values as a function of time). The computation of this sub-step 448 provides reverted FFT values or reverted data values.

Still referring to FIG. 6, sub-step 450 comprises forming a response curve by connecting the reverted data values of sub-step 448 with a line.

Still referring to FIG. 6, sub-step 452 of the second step 440 comprises computing "power in the signal" values (also referred to as "signal power values" and/or "integrated signal power") for each sensor using the reverted FFT values of sub-step 448. This computation is performed by determining the area under the response curve. That is, integrating the function of the response curve. The area will include or extend under the response curve to a line corresponding to a zero (0) baseline for the gradient values (the zero baseline). Additionally, this computation of sub-step 452 uses the absolute values of the negative values of the reverted FFT values, so such negative values do not subtract from the computed signal power values. That is, the absolute values of the negative values of the reverted FFT values are added to the positive values of the reverted FFT values before the integration is performed. This computation of sub-step 452 can be referred to as the "signal power method" and determines a total power value of the signal (integrated signal power) for the raw magnetic data detected by each sensor.

Figure 7:
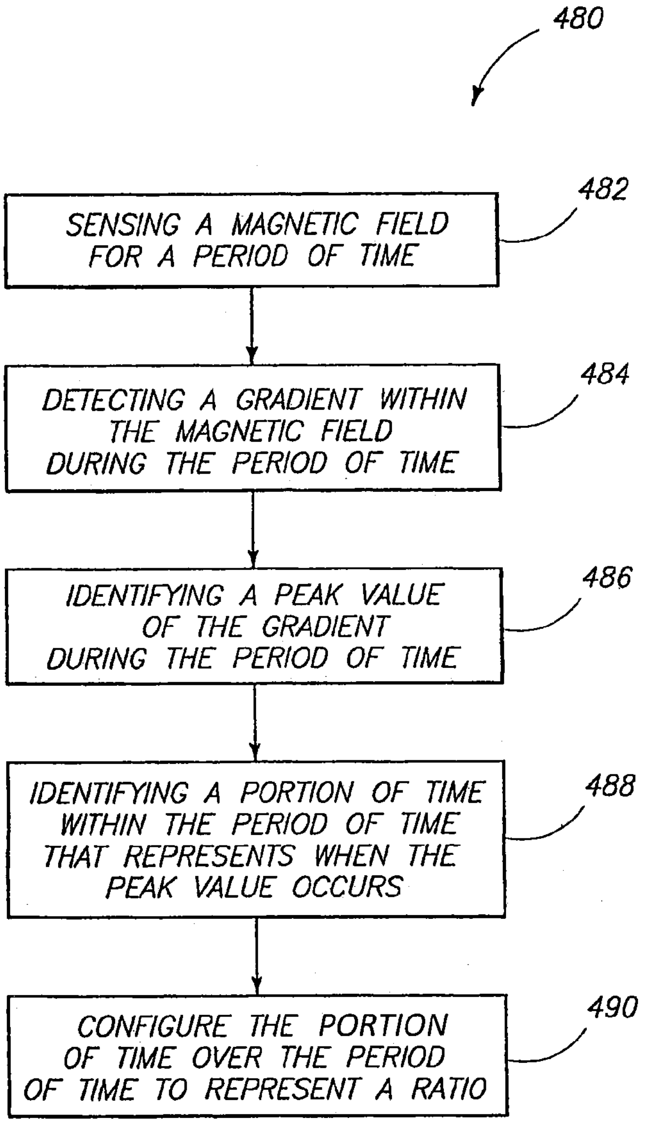
FIG. 7 is an exemplary data analysis method according to one of various embodiments of the present invention.

Referring to FIG. 7, a third step 480 of the feature extraction method is described. Sub-step 482 comprises sensing a magnetic field for a period of time. The sensing or measurement event produces an output signal or raw magnetic data of each sensor. The raw magnetic data is used and configured into response curves similar to FIGS. 2-4. That is, the raw magnetic data can be configured as response curves for value(s) of magnetic field gradient(s) being outputted from each sensor and plotted with respect to the period of time.

Still referring to FIG. 7, sub-step 484 of the third step 480 comprises detecting a gradient within the magnetic field during the period of time wherein the raw magnetic data represents the magnetic field gradients in the magnetic field. As stated previously, the raw magnetic data is configured into the response curves.

Still referring to FIG. 7, sub-step 486 of the third step 480 comprises identifying a peak or maximum value (in an absolute value sense) of the gradient detected during the period of time and which is outputted from each magnetic sensor and represented in the response curve of sub-steps 482 and 484.

Still referring to FIG. 7, sub-step 488 of the third step 480 comprises identifying a portion of time within the period of time that represents when the peak value of sub-step 486 occurs.

Still referring to FIG. 7, sub-step 490 of the third step 480 comprises configuring the portion of time over the period of time to represent a ratio. The ratio has as a numerator the specific point in time that the peak gradient value of sub-step 486 occurs over a denominator that comprises the entire period of time. This dimensionless ratio of times (time over time) value represents the first instant in the time period window that each sensor detects an object over or relative the entire time period window. Moreover, this dimensionless ratio of times is used to determine whether a ferrous object is located in the front area or the back area of a body passing through the portal passageway 108 of security screening system 100(FIG. 1). That is, the position of the object relative to the body is determined by comparing the ratio of when the object is first detectable within the signal over the total duration of the sample period of time. If the ratio value is less than 0.5, the interpretation is made that the object is positioned or located in the front area of the body. If the ratio value is greater than 0.5, the interpretation is made that the object is positioned or located in the back or rear area of the body. Additionally, an interpretation as to how forward an object is positioned relative the body can be determined by how small the ratio value is, that is, the smaller the ratio value, the closer to the front of the body the object is positioned.

The above exemplary various embodiments of the feature extraction methods are completed and provide individual magnetic sensor data that is summarized using the "features" data computed above. Various other embodiments of data analysis methods are now described that verify detection and provide location information for a ferrous object within portal passageway 108 of system 100. These additional data analysis methods can be characterized as the "composite portal analysis and object location methods" (hereinafter, also referred to as the "object location methods"). The object location method is directed to determining the location of a ferrous object within a passageway wherein the location includes a vertical aspect relative the ground level and a horizontal aspect relative a lateral distance from at least one sensor or sensor array (alternatively stated, relative a lateral distance from one column of magnetic sensors).

To illustrate various exemplary embodiments of the object location methods, the computations to be described were based on output responses from sensors in a security screening system, such as system 100, measuring or sensing a ferrous object positioned in a portal passageway (for example, portal passageway 108) at the following location: 1) a ferrous object (hereinafter, also referred to as an object) placed in a front shirt pocket of a person passing through portal passageway 108 of system 100 (FIG. 1); and 2) the pocket was positioned approximately 46 inches above ground level 118 and approximately 6 inches laterally of center line 120 of portal passageway 108.

Figure 8:
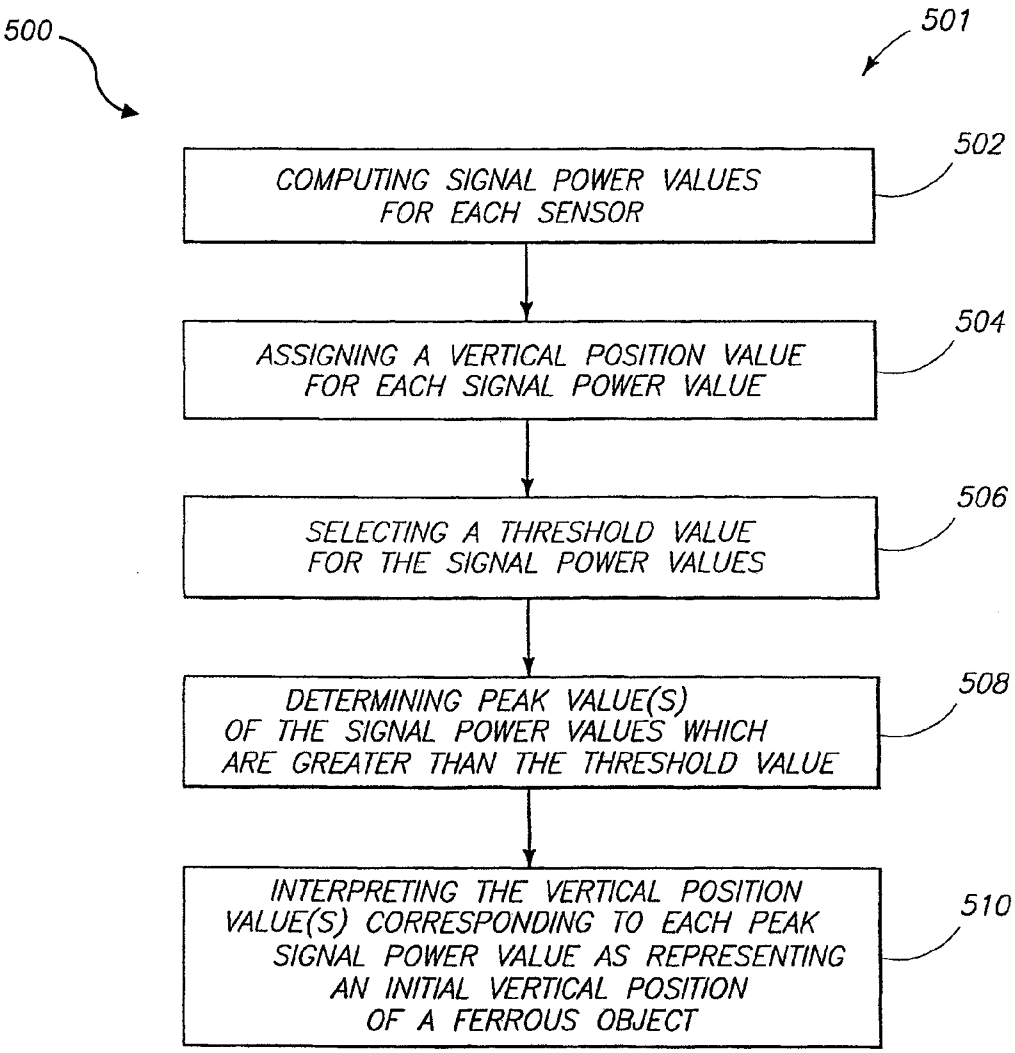
FIG. 8 is an exemplary data analysis method according to one of various embodiments of the present invention.

Referring to FIG. 8, a first embodiment 501 of various steps of the object location method 500 is described and comprises determining an initial vertical position of the ferrous object within the portal passageway. In sub-step 502, signal power values (integrated signal power) are computed for each sensor of system 100. The signal power values are computed from the "signal power method" as previously described with respect to the feature extraction method (second step 440) illustrated in FIG. 6 (particularly, sub-step 452).

Still referring to FIG. 8, in sub-step 504, a vertical position value is assigned for each signal power value wherein the vertical position value represents the vertical position relative the ground level for each sensor outputting the corresponding signal power value (see graphical representation 530 of FIG. 9 and discussed below). That is, each signal power value is represented as a function of respective vertical positions of the magnetic sensor that outputted the signal power value.

Still referring to FIG. 8, in sub-step 506, a threshold value is selected for the signal power values. The criteria for selecting the threshold value will depend on the type or characteristics of the magnetic sensor being used in system 100, wherein the threshold value selected will essentially represent sensor instability and electronic noise for the characteristic of the sensor used. That is, relying on signal power values greater than the threshold value for subsequent calculations or computations will effectively negate or null sensor instability and electronic noise from the calculations for the particular sensor being used. It should be understood that this sub-step 506 of selecting the threshold value could have been performed previously as sub-step 502 or sub-step 504. Moreover, as explained previously, different threshold values can be implemented for different exemplary magnetic sensors having different operational features and/or characteristics. For example, one exemplary security screening system uses an exemplary threshold value of five (5) nT/m/sec (nanoTesla/meter/second) (also characterized as units of "gradient-seconds" represented as (nT/m)/s).

Still referring to FIG. 8, sub-step 508 comprises determining peak or maximum value(s) of the signal power values that are greater than the threshold value. It should be understood that this definition of peak or maximum value(s) includes any local spikes or peaks in the response curves for the signal power values. Accordingly, there may be a plurality of peak signal power values for respective response curves.

Still referring to FIG. 8, sub-step 510 interprets each peak signal power value as indicating or representing the detection of a ferrous object. Sub-step 510 further includes determining the vertical position value corresponding to each peak value and interpreting the vertical position value as indicating a vertical location of the ferrous object relative to the ground level 118 of system 100 (FIG. 1).

Figure 9:
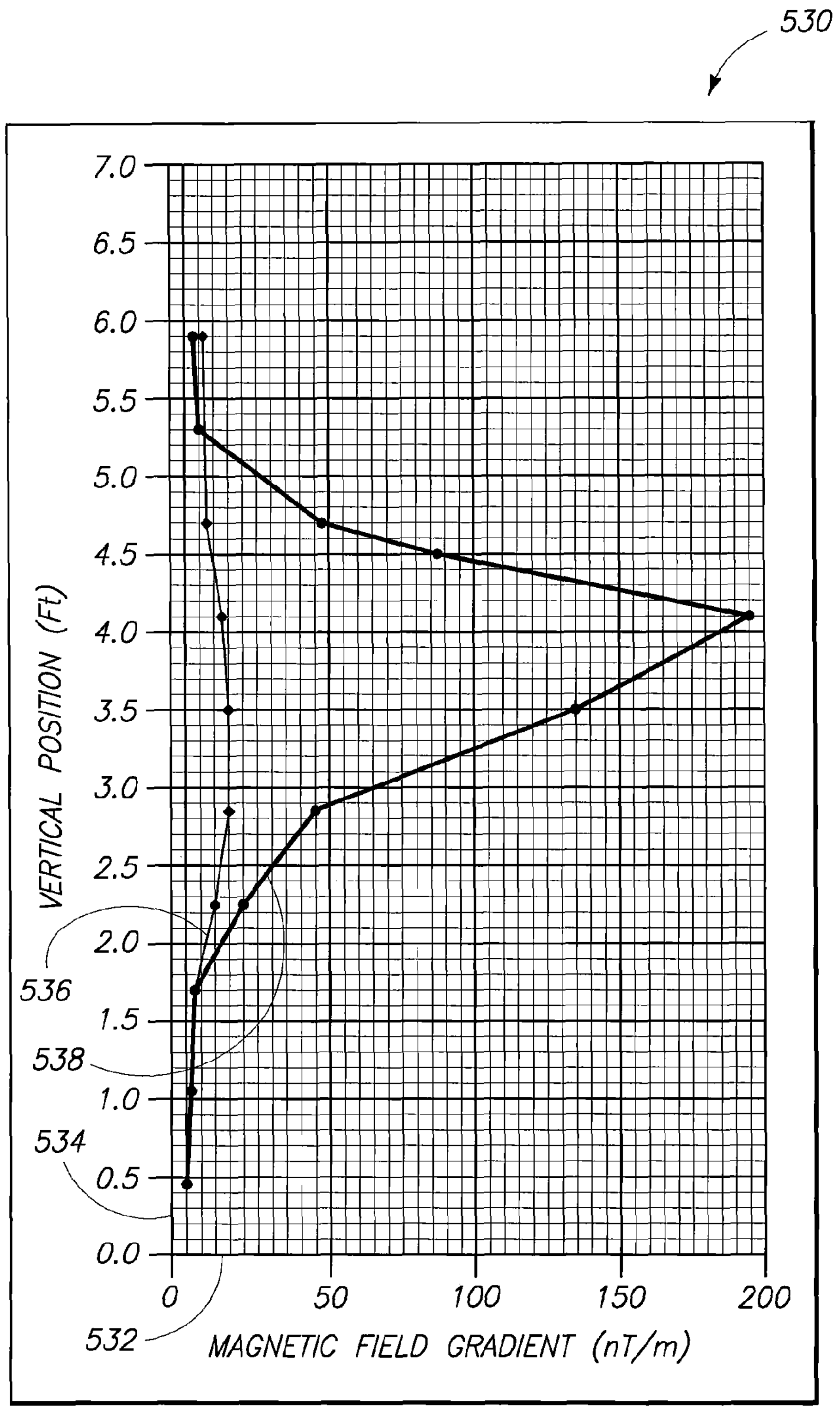
FIG. 9 is a graphical representation of magnetic data obtained from the exemplary magnetic sensors of the security screening system of FIG. 1 illustrating the inventive data analysis method of FIG. 8.

Referring to FIG. 9, graphical representation 530 (also referred to as an integrated signal power plot) illustrates the signal power values (integrated signal power) plotted as a function of the respective vertical position of the magnetic sensor that outputted the corresponding signal power value. Graphical representation 530 comprises two response curves 536 and 538 of the signal power values. The two response curves 536 and 538 represent the two respective columns 110 and 112 of portal structure 106 having arrays 132 and 134 of sensors 102 and 104 in portal structure 106 for system 100 (FIG. 1). A horizontal axis 532 of graphical representation 530 represents the signal power values for each sensor and a vertical axis 534 represents vertical position values (in units of feet) from ground level 118 of system 100.

Still referring to the graphical representation 530 of FIG. 9, the response curves 536 and 538 have one peak signal power value corresponding to a vertical position value of approximately four feet. This vertical position value is interpreted as the vertical location of the ferrous object which corresponds closely to the actual placement of the ferrous object in the pocket of the person passing through system 100. It should be understood that if a plurality of peak signal power values exist, each one can be processed as if each represents an indication and location of a different and separate ferrous object. Accordingly, the object location method 500 may indicate a plurality of ferrous objects. Subsequent data analysis methods and processing are discussed more thoroughly to discern if a plurality of peak signal power values accurately indicates a plurality of ferrous objects.

The above computation finishes the initial vertical position determination of the ferrous object according to the first exemplary step 501 of the object location method 500. A horizontal aspect or position of the ferrous object can now be determined. After determining this horizontal aspect of the ferrous object, a data analysis method is presented which computes a final vertical position of the ferrous object.

It should be understood that horizontal position is defined as a horizontal distance between a ferrous object and a magnetic sensor or column of either one of the pairs of arrays 132 and 134 of system 100. For example, returning to FIG. 1, an exemplary distance is represented by distance line 122 which extends between center line 120 and one of sensors 104 (any one sensor 104) in the right-hand array 134 of system 100. Exemplary distance line 122 is perpendicular to center line 120 and parallel to ground level 118. It should be understood that a horizontal distance can be determined that extends between center line 120 and a sensor 102 (any one sensor 102) in the left-hand array 132 of system 100. If the center line 120 is close to being at the center of the passageway 108, then distance line 122 will approximately equal a horizontal distance between any one sensor 102 and center line 120.

To determine the horizontal aspect of the ferrous object, begin with the peak signal power values (also referred to as "integrated signal power peaks") computed and interpretations realized in respective sub-step 508 and sub-step 510 from the first exemplary step 501 of the object location method 500 (FIG. 8). That is, ferrous object(s) previously located with respect to the vertical aspect of method 500 are now used to determine the horizontal location of the ferrous object(s). This horizontal determination relies upon a $1/r^2$ model wherein "r" is the horizontal distance between the ferrous object and the nearest sensor in the left column or left array 132. The "nearest sensor" is defined with respect to two aspects for "nearest." In the first aspect, referring to FIG. 1, the "nearest sensor" is the sensor nearer to the ferrous object as between respective sensors 102 and 104 of respective arrays 132 and 134. In the second aspect, assuming the magnetic sensors 102, 104 of system 100 are configured as gradiometers having at least a pair of sensors, the "nearest sensor" is the sensor of the pair that is closer to the portal passageway 108 of system 100.

The $1/r^2$ model mentioned above is represented by the following equation:

$$I = I_o * \frac{1}{r^2},$$

where:

- $I_o$=Integrated signal power (signal power value) of the magnetic field at the ferrous object
- r=Horizontal distance (as defined previously) from the ferrous object to the "nearest" magnetic sensor (as defined previously)
- I=Calculated integrated signal power (signal power value) of the magnetic field from the gradient (magnetic) data at the respective magnetic sensors (i.e., gradient values represented in graphical representation 530 of FIG. 9, that is, the integrated signal power plot).

This equation will estimate the behavior of the near-field disturbance $I_o$ (signal power value) and its intensity as a function of horizontal distance from the ferrous object. The premise is that the integrated signal power I (signal power value I) of the magnetic field at the magnetic sensor is proportional to the inverse of the distance squared from the ferrous object. The horizontal aspect is determined by noting the measured or calculated integrated signal power (signal power value) at both sides of the portal structure for the integrated signal power peak(s) of interest and solving for the integrated signal power (signal power value) at the ferrous object using gradient (magnetic) data from both sides of the portal structure (in FIG. 9, along a horizontal line from the peak value of the one response curve 538 to the other response curve 536). The integrated signal power $I_o$ at the ferrous object and the horizontal distance "r" from the ferrous object to the magnetic sensor (represented as outputting the peak value) are unknown. However, by using both sides of the portal structure, there are two equations and two unknowns to solve.

Accordingly, determining the initial horizontal position aspect of the object location method 500 comprises rearranging the $$I = I_o * \frac{1}{r^2}$$

equation for both columns of sensors (response curves 538 and 536 of FIG. 9) into the following quadratic equation for horizontal distance "r" that can be easily solved: $0=(P_r-P_l)r^2-2wP_r r+P_r w^2$, where:

- $P_r$=Integrated signal power at the sensor in the right side or column of the portal structure
- $P_l$=Integrated signal power at the sensor in the left side or column of the portal structure
- r=Horizontal distance from the ferrous object to the sensor in the left side or column
- w=Width of the portal passageway of the portal structure The quadratic equation uses the left side or column of the portal structure as a reference point (or zero point) with horizontal distance "r" increasing as a distance from the left side increases (and alternatively as distance to the right side of the portal structure decreases). It should be understood that the right side or column of the portal structure could have been used as the reference point wherein horizontal distance "r" would be represented as a negative (−) value (negative in sign). Selecting the left side or column of the portal structure as the reference point will result in a more conventional coordinate system. Horizontal distance "r" is a variable that spans the entire width of the passageway of the portal structure.

Accordingly, solving the quadratic equation provides the horizontal distance "r" of the ferrous object relative a sensor in the left side or left column of the portal structure. Accordingly, the ferrous object was detected as existing in the portal passageway, and an initial vertical position and a horizontal position of the ferrous object within that portal passageway has been determined.

Relying on the $1/r^2$ model just described, another embodiment of an exemplary data analysis method is described for adjusting the initial vertical position of the ferrous object, that is, a final vertical position. The initial vertical position of the ferrous object was determined as having the same vertical position as a vertical position of one of the sensors. That is, no determination of the vertical location or position of the ferrous object between respective, vertically spaced sensors. Accordingly, vertical adjustments are made using the $1/r^2$ model and comparing the measured magnetic disturbances between respective vertically spaced sensors next to or surrounding an identified peak signal power value (integrated signal power value). Between the two sensors, the one sensor outputting the larger integrated signal power value proximate the peak integrated signal power value (in gradients) will influence the determination of the location of the ferrous object in that direction (up or down) toward the one sensor.

Figure 10:
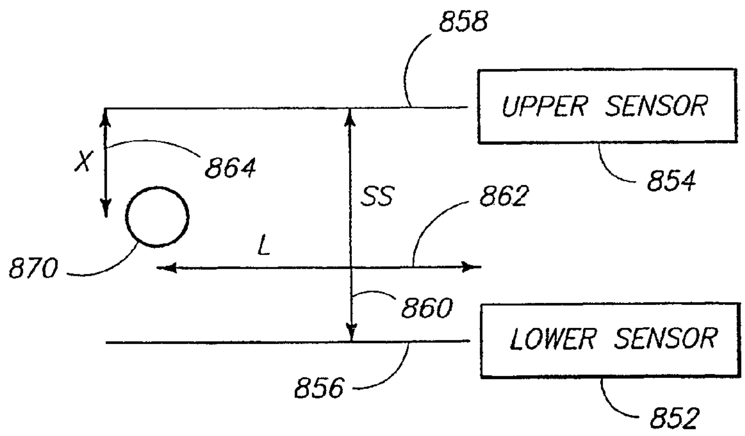
FIG. 10 is a geometric illustration of an exemplary ferrous object positioned relative vertically spaced magnetic sensors within the portal passageway of the security screening system of FIG. 1 to facilitate discussion of an exemplary data analysis method according to one of various embodiments of the present invention.

For example, referring to FIG. 10, an exemplary position of a ferrous object is illustrated relative or between the exemplary geometry or configuration of two vertically spaced sensors. It should be understood that the ferrous object may have an exemplary horizontal position within the passageway 108 of system 100 and be positioned between any two vertically spaced sensors. The vertical position of the ferrous object is determined in some embodiments by solving the following quadratic equation:

$$0=(P_l-P_u)*x^2-2*ss*P_l*x+(P_l-P_u)*L^2+ss^2*P_l, \text{ where:}$$

| | |
|---|---|
| x = | Distance to solve for from the upper sensor to the object |
| $P_l$ = | Lower sensor integrated signal power |
| $P_u$ = | Upper sensor integrated signal power |
| ss = | Sensor vertical spacing |
| L = | Horizontal distance from sensors to the object |

Still referring to FIG. 10, the geometric configurations and dimensions correspond to the variables for the above quadratic equation. Upper sensor 854 has the greater vertical height above ground level relative to a lower sensor 852. Ferrous object 870 is positioned vertically between lower and upper sensors 852 and 854. Distance 864 between the ferrous object 870 and upper sensor 854 is represented by variable "x" and is the dimension to be solved as the other variables are previously selected or computed/determined. Horizontal line 856 represents the elevational location of lower sensor 852 for measurement purposes. Horizontal line 858 represents the elevational location of upper sensor 854 for measurement purposes. Distance 860 represented by variable "ss" is the preselected dimension of vertical spacing between sensors 852 and 854 and is illustrated as between respective horizontal lines 856 and 858. Distance 862 between the ferrous object 870 and array of sensors (assuming sensors are aligned vertically in the vertical column or portion 110 of portal structure 106) is represented by variable "L". Distance 862 (variable "L") is the horizontal dimension r computed previously using the initial horizontal position aspect of the object location method 500 (FIGS. 8 and 9).

Regarding the above-described exemplary data analysis methods using integrated signal power methodologies, such methods may produce anomalies for some structural designs or configurations of ferrous objects. That is, two or more ferrous objects may be allegedly detected or indicated when only one ferrous object exists in the portal passageway 108. For example, two or more integrated signal power peaks (peak signal power values) called "ghost alarms" may be present in the integrated signal power curves for a single ferrous object. Exemplary structural designs that produce ghost alarms characteristically have one dimension that is significantly thin and longer relative any other dimension of the ferrous object. This configuration of a ferrous object (also referred to as "ghost object") tends to produce separate and distinct magnetic field poles, a positive pole and negative pole. These separate and distinct poles are detected by the array of sensors, which influences the shape of the integrated signal power curves relied upon for implementing the embodiments of the object location method 500.

For example, as the magnetic field changes from one pole to the other, the shape of the response curve dips or has a null region (local minimum value) leaving two local maximum values (or two integrated signal power peaks) in the response curve. That is, an ideal response curve for a single ferrous object will have a single integrated signal power peak with a steadily increasing and decreasing shape (laterally extending bell curve) as illustrated in FIG. 9. However, the response curve for ghost object(s) will have at least two integrated signal power peaks giving the impression that there are two separate ferrous objects when there is only a single ferrous object. To address ghost alarms, a "ghost alarm reduction method" 580 according to various embodiments of the invention is used to identify and resolve ghost alarms. Various exemplary embodiments of the ghost alarm reduction method 580 rely on a series of "fuzzy logic" rules to consolidate the ghost alarms into a single integrated signal power peak in the response curve when a single ferrous object exists in passageway 108 of system 100.

Figure 13:
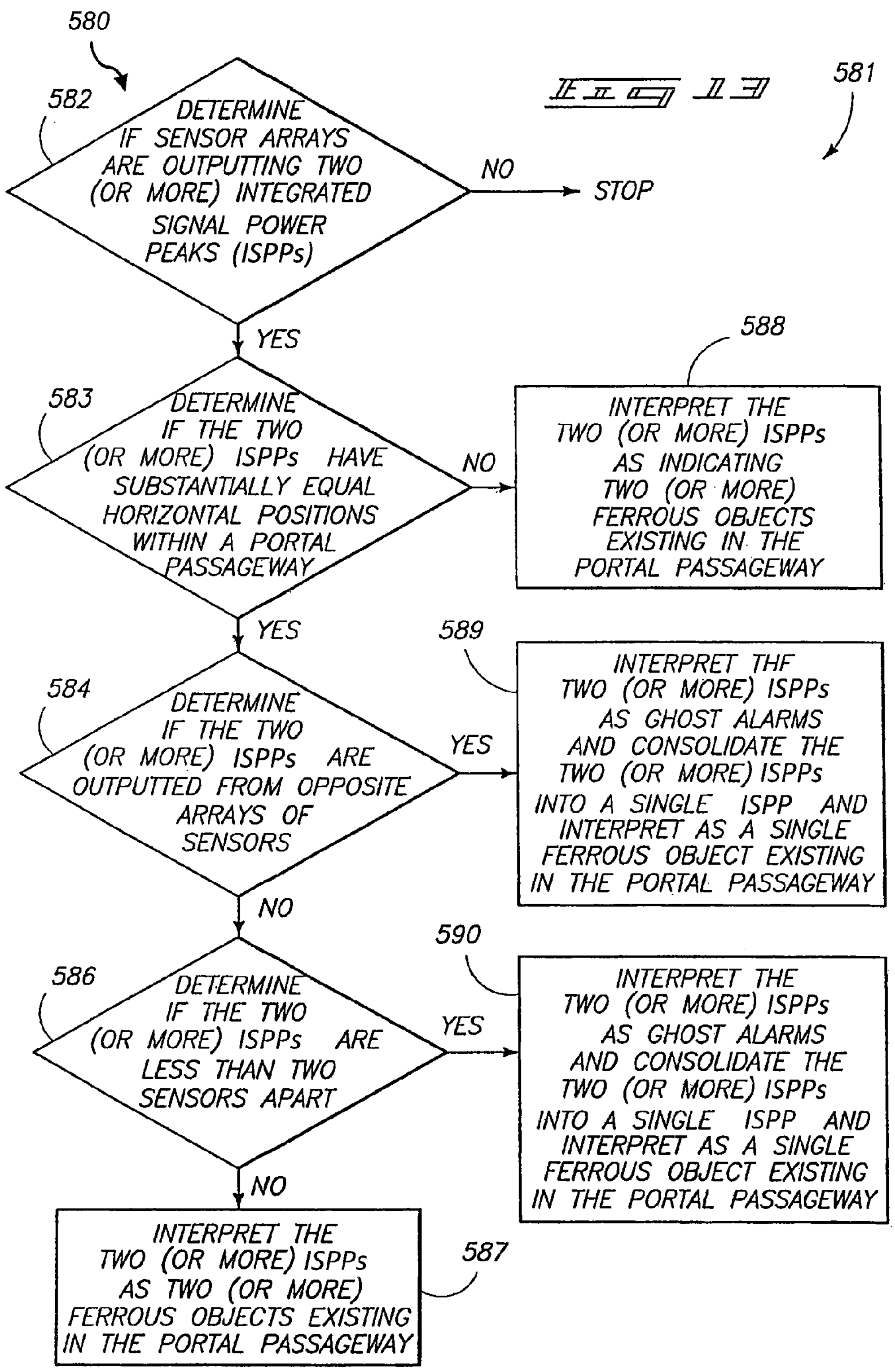
FIG. 13 is an exemplary data analysis method according to one of various embodiments of the present invention.
Figure 11:
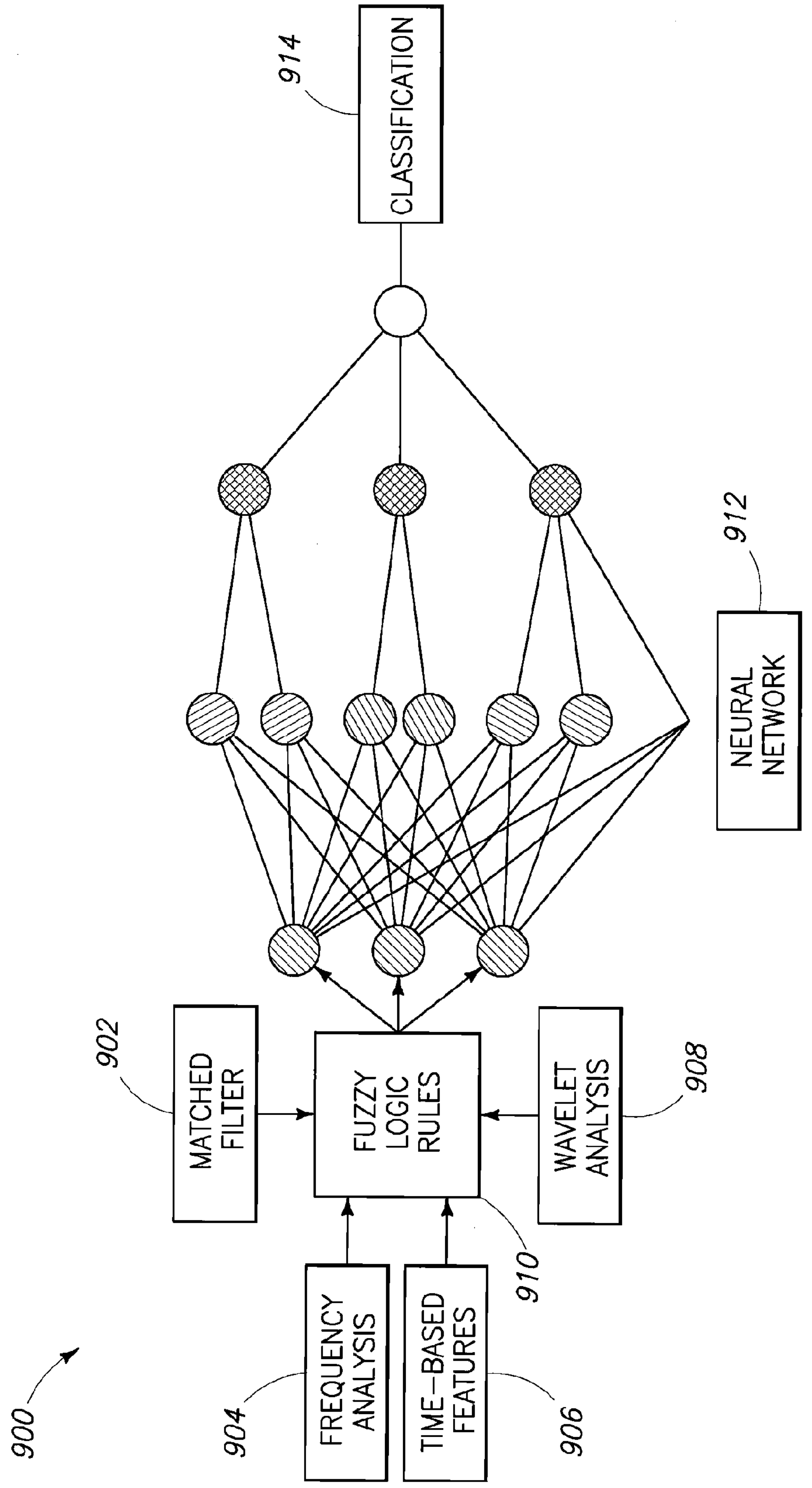

For a first exemplary embodiment 581 of the ghost alarm reduction 580, consider FIG. 13. In step 582 of FIG. 13, a determination is made as to whether the arrays or columns of sensors are outputting two or more integrated signal power peaks (ISPPs). If yes, proceed to step 583. If no, stop.

Still referring to FIG. 13, in step 583, a determination is made as to whether any two of the integrated signal power peaks (ISPPs) have substantially equal values for horizontal positions or horizontal distances relative the left column of the portal structure (previously calculated as horizontal distances "r"). If no, proceed to step 588 and interpret the integrated signal power peaks as indicating a separate ferrous object for each integrated signal power peak, that is, two or more ferrous objects existing in the portal passageway, and then stop. If yes, proceed to step 584.

Still referring to FIG. 13, in step 584, determine if the two integrated signal power peaks are outputted from opposite arrays or columns of sensors, for example, by locating one peak value in each one of the two response curves. If no, proceed to step 586. If yes, proceed to step 589 and interpret the two integrated signal power peaks as representing ghost alarms and consolidate the two integrated signal power peaks into a single integrated signal power peak, and then stop. Accordingly, the single integrated signal power peak should be interpreted as representing a single ferrous object existing in the portal passageway. Additionally, the single ferrous object may be interpreted as representing a large ferrous object.

The rationale or logic for consolidating the two integrated signal power peaks is based on the following assumptions: a) that the peak values were generated by a single, long and slender object; and b) the single, long and slender object was oriented at an angle with respect to the vertical axis of the portal passageway 108. In this orientation of the single, long and slender ferrous object, one of the magnetic poles produced by the ferrous object was "cast" to (or was detected by) an elevationally different sensor (lower or higher) which was located in the opposite column (opposite side) of the portal structure 106. In the integrated signal power curve, the consolidation will provide the single integrated signal power peak centrally between the two original integrated signal power peaks, in both the vertical aspect and the horizontal aspect. It should be understood that, generally, the greater move or repositioning will occur in the vertical aspect of the curve, that is, along the vertical axis of the curve because the two original integrated signal power peaks were nearly equal along the horizontal axis (i.e., had substantially equal horizontal positions). Accordingly, not much repositioning is needed along the horizontal axis, or in the horizontal aspect of the response curve.

Moreover, it should be understood that because the two integrated signal power peaks were determined in step 584 not to be outputted from the two opposite arrays or columns of sensors, conclude that the only other orientation is that the two integrated signal power peaks are outputted from the same column and array of sensors, and go to step 586.

Still referring to FIG. 13, in step 586, determine if the two integrated signal power peaks are less than two sensors apart. If yes, proceed to step 590 and interpret the two integrated signal power peaks as representing ghost alarms and consolidate the two integrated signal power peaks into a single integrated signal power peak. Interpret the single integrated signal power peak as representing a single ferrous object, and then stop. If no, proceed to step 587 and interpret the two integrated signal power peaks as representing two ferrous objects existing in the portal passageway, and stop.

The rationale or logic for combining these two integrated signal power peaks outputted from the same array of sensors is because the features of the long ferrous object provide the positive and negative magnetic poles that are clearly resolvable by the sensors. As the response curve registers (or outputs) the transition of one magnetic pole to the other, as stated previously, the response curve goes through a null region that appears to the sensors to be void of ferrous material or an object. It should be understood that this logic assumes that the sensors are not capable of resolving or discerning signatures or outputs from two large ferrous objects that are closer than the distance between two vertically spaced sensors.

The ghost alarm reduction method 580 consolidates the ghost alarms whether they occurred as signals from a single column of portal structure 106 or from opposite columns of system 100. Another exemplary method for addressing ghost alarms and locating ferrous object positions is based on the analyses and methods disclosed in U.S. Pat. No. 6,150,810, which were based on maximum signal methods. These maximum signal methods can be used to supplement the integrated signal power data analysis disclosed in the present application. To summarize, the maximum signal methods reduce the magnetic data acquired from each sensor during the magnetic data acquisition period into a single maximum gradient value. Comparing the graphical representation (plot) of gradient values using the maximum signal analysis with the graphical representation (plot) of gradient values using the integrated signal power analysis demonstrates how the maximum signal analysis resolves ghost alarms.

Consider outputted magnetic data from the same ferrous object, for example, a small gun, having one dimension that is significantly longer than the other dimensions. The gun is positioned approximately 44 inches above ground level 118 on the right side of portal passageway 108 (right of center line 120 of FIG. 1). As stated previously, ferrous objects having one long dimension produce a magnetic field with separate and distinct magnetic poles (positive and negative magnetic poles) wherein the sensor configuration is capable of distinguishing the magnetic poles. Moreover, the magnetic field produces a null region or dip area where the polarity of the magnetic field is switching from one magnetic pole to the other. This feature of the magnetic switching between the magnetic poles affects the response curves for respective analyses of the maximum signal analysis versus the integrated signal power analysis.

Figure 11:
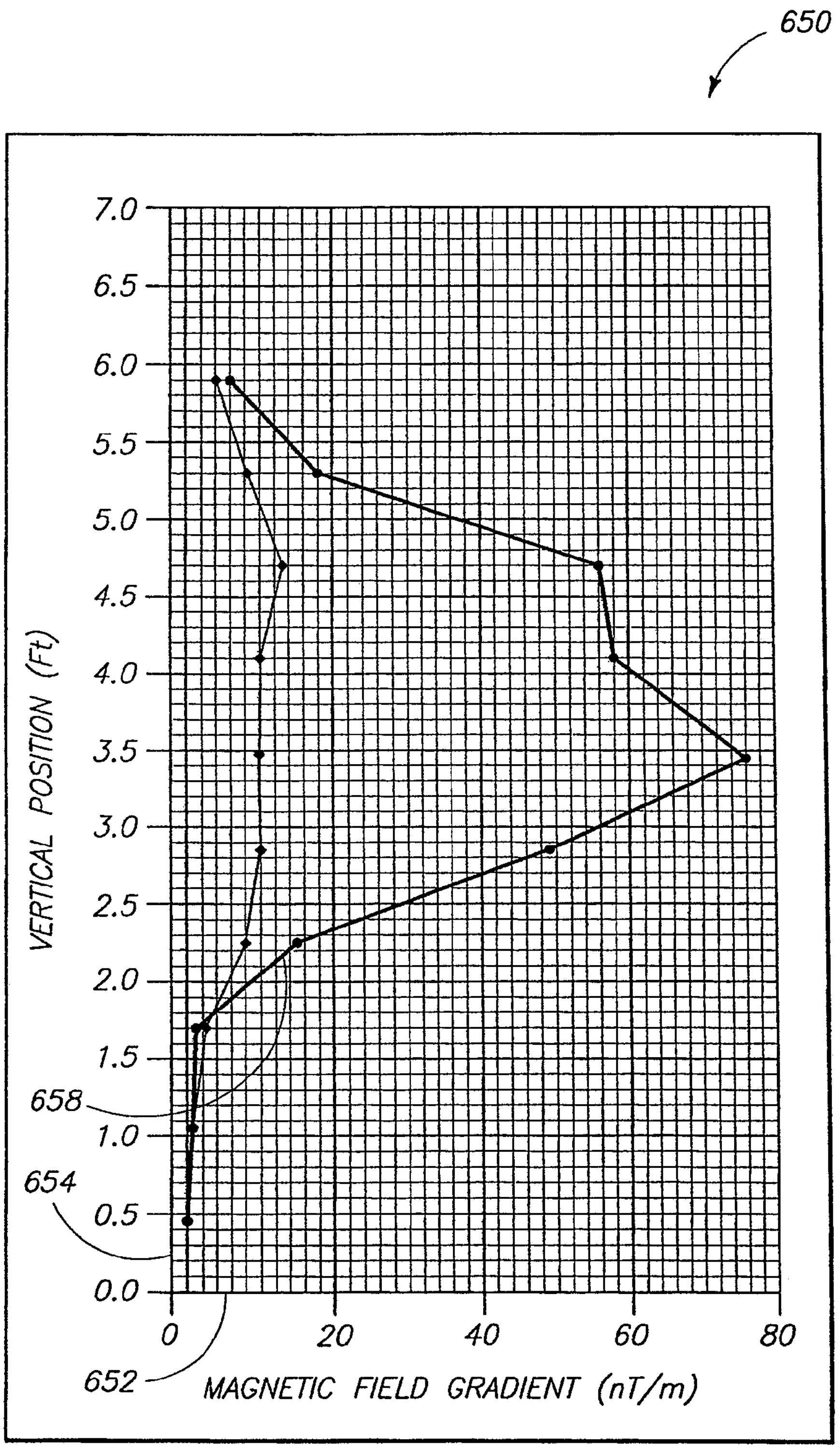
FIG. 11 is a graphical representation of magnetic data obtained from the exemplary magnetic sensors of the security screening system of FIG. 1 illustrating an exemplary data analysis method according to one of various embodiments of the present invention.
Figure 12:
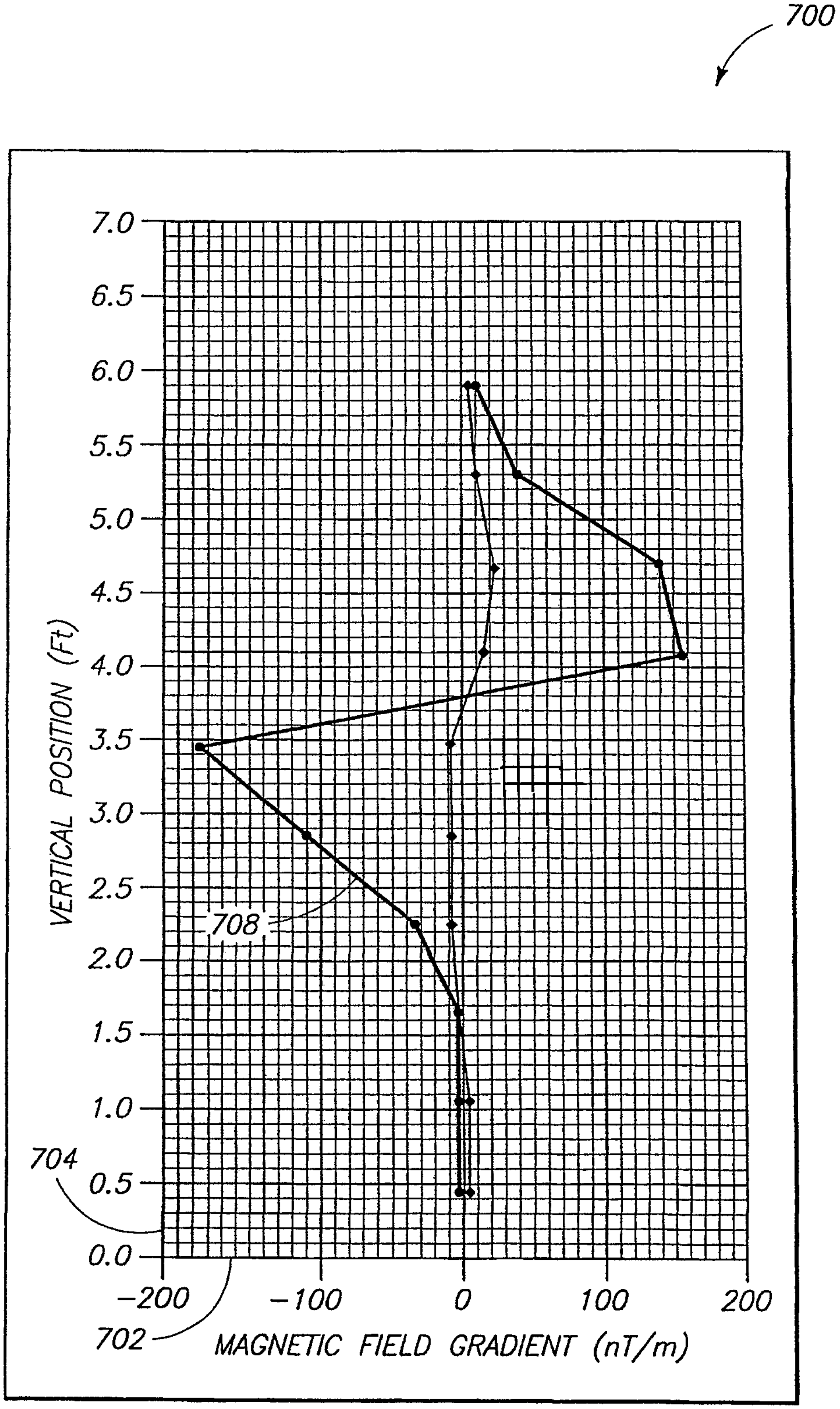
FIG. 12 is a graphical representation of magnetic data obtained from the exemplary magnetic sensors of the security screening system of FIG. 1 illustrating an exemplary data analysis method according to one of various embodiments of the present invention.

For example, referring to FIGS. 11 and 12, the graphical representation 650 (FIG. 11) of gradient values outputted from the small gun using the integrated signal power analysis is compared with the graphical representation 700 (FIG. 12) of gradient values outputted from the small gun using the maximum signal analysis. Both graphical representations 650 and 700 illustrated in respective FIGS. 11 and 12 have gradients represented along the respective horizontal axes 652 and 702, and have vertical positions in feet represented along the respective vertical axes 654 and 704. The respective response curves 658 and 708 of FIGS. 11 and 12, respectively, represent the magnetic data from the sensors in the right side of the portal structure 106.

The response or signature curve 658 (FIG. 11) produced using the integrated signal power analysis (without ghost alarm fuzzy logic rules) indicates three maximum or peak values, which may be interpreted as indicating three different ferrous objects are located in the right side of portal passageway 108. In contrast, the response or signature curve 708 (FIG. 12) produced using the maximum signal analysis has a large dipole signature, which more than likely will be interpreted as indicating a single ferrous object is located in portal passageway 108. Accordingly, the maximum signal analysis is used to supplement the integrated signal power analysis, in some embodiments, for consolidating ghost alarms to more accurately indicate the existence and location of ferrous object(s) that need to be further investigated as potential weapons.

Other exemplary methods for analyzing raw magnetic data according to various embodiments of the invention are now described and are collectively termed "pattern classification methods." The "pattern classification methods" use aspects of, and values determined from, the previously described data analysis methods. Accordingly, background for the previously described data analysis methods (and the previously described data analysis methods themselves) is reiterated and summarized in a different perspective to facilitate understanding of the various inventive embodiments of the "pattern classification methods."

Generally stated, an exemplary embodiment of a pattern classification method extracts unique features from raw magnetic response data or signals (magnetic data, magnetic signal or magnetic response). These features are used to discriminate between threatening objects and non-threatening objects. The features are processed by various classification methods to automatically identify the class of object being detected or sensed during a measurement event. The automatic identification of the class of object being detected results in an intelligent security screening system to greatly reduce false alarms that result from benign objects, such as shoe shanks.

It should be understood that for successful classification, magnetic signals or data must contain information characteristic of the object being sensed or detected. Moreover, methods have to be available to extract the characteristic information from the magnetic signals or data. The characteristic information must be unique, reproducible and readily processed by the pattern classification methods. Exemplary embodiments of the pattern classification methods according to various embodiments of the invention use quantitative anomaly detectors and physics-based discrimination schemes to distinguish between threatening and non-threatening objects.

The inventive pattern classification methods resolve the typical analysis and processing challenges that occur using passive magnetic sensing applications. Exemplary typical analysis and processing challenges include: (1) a relative small sampling period which is a function of the speed of passage through the portal by a ferrous object (i.e., the speed of a moving person); (2) the raw magnetic data or response, which is relatively a narrowband signal, near DC; and (3) the raw magnetic data or response, which is a transient signal. These typical challenges arise because conventional magnetic sensing applications are poorly suited to process magnetic signals or data that change suddenly and/or unpredictably, which is characteristic of the unpredictability of magnetic fields that produce the magnetic signals or data. However, as stated above, it is recognized that the instantaneous magnetic field variations often carry the specific information characteristics (or magnetic data) indicative of specific classes of ferrous objects that can be used as "fingerprints" to discriminate between the specific classes of ferrous objects.

Various embodiments of the "pattern classification methods" will use aspects of the following previously discussed data analysis methods:

1) The acquisition of real-time data from magnetic sensors and subsequent data reduction/summarization methods:
   a) raw magnetic data reduced (feature extraction) based on the signed (plus or minus (+/−)) minimum and maximum method; and
   b) raw magnetic data reduced based on the power in the response signal computed by the integration method;
2) Analysis of magnetic sensor data for ferrous object location:
   a) ferrous object locations assigned based on maxima of signal power as a function of sensor position;
   b) ferrous object locations positioned in the horizontal plane using the $1/r^2$ model;
   c) ferrous object locations positioned in the "z" plane using the front/back location function; and
3) Ghost alarm reduction using the dipole analysis.

According to various embodiments of the pattern classification methods, the following values computed by the previously discussed data analysis are provided to the pattern classification methods:

1. Maximum signal features (one per sensor): derived from the methods that reduce the sensor data to a single value based on the maximum gradient observed during the data acquisition period;
2. Standard power density features (one per sensor);
3. Position of the target (ferrous object) in the "z" plane: ratio of when first peak occurs to the overall length in time of the trace. The ratio will be used as a front/back discriminator;
4. Dipole analysis results; and
5. Standard deviation and mean values of overall raw magnetic data.

In addition to these previously discussed data analysis methods, the following new data analysis methods are disclosed to further assist the classification process performed by the inventive exemplary pattern classification methods:

1. Symmetry fitness coefficients derived through comparing opposite sensors (e.g., simple ratio). The coefficients are potential indicators of, for example, underwire bras and steel shank shoes; and
2. Probability of gun coefficient where the probability is derived through analysis (e.g., fuzzy logic) of multiple deflections in the magnetic data response signals (or portal-level spectral waveform) that are potential indicators of, for example, complex ferrous objects such as guns.

In other exemplary embodiments of the invention, a fusion of methods is performed to optimize performance of the passive magnetic sensors in an exemplary security screening system. In one embodiment of the invention, the following exemplary analysis methods are fused: i) time domain feature extraction; ii) wavelet analysis; iii) matched filter detection; and iv) model-based frequency analysis. The values derived or computed from these exemplary analysis methods are further processed, for example using fuzzy logic, to increase the probability of accurate classification using various embodiments of the inventive pattern classification methods.

One of the various exemplary pattern classification methods begins by gathering raw magnetic data, for example, from security screening system 100. Raw magnetic data is obtained from magnetic sensors and represented as magnetic field gradients relative time. The magnetic data is acquired at user-selectable sample rates, for example, ranging from DC to 100 KHz. Sensor-level digital signal processor (DSP) firmware extracts features and magnetic patterns from the raw magnetic data. Moreover, the sensor-level magnetic data and features thereof can be remotely interrogated through any of various communication protocols, for example, TCP-TP data transfer, RS-485 and USB. Additionally, the extracted features and magnetic patterns can be further post-processed by a standard desktop or laptop computer using custom software, for example, National Instruments' LABVIEW™. The extracted features and magnetic patterns from each sensor of security screening system 100 are analyzed as groups to provide additional information, such as symmetry and complex dipoles from large ferrous objects.

For the following described exemplary methods of the invention, it should be understood that "features" or "feature extraction" is defined as "repeatable characteristics in the raw magnetic data that are consistent for the same group or class of detectable ferrous objects." An example of a "group" or class includes: guns, knives, cell phones, bras having structures with wire, and steel shank shoes. According to various embodiments of the invention, the features are available in the time domain, the frequency domain, and the two frequencies combined, that is, the time/frequency domain. Other pertinent features of the magnetic data conducive to classification of the ferrous objects are obtained, which include magnitude and location of the magnetic response.

The previously described data analysis methods analyzed the features using a combination of empirical and physics-based models to pinpoint ferrous objects and the relative "magnetic" sizes. That is, the dominant ferrous object (represented as outputting the magnetic signal response having the greatest magnitude or peak) is located generally vertically within the portal passageway (portal) by first associating the vertical location of the magnetic sensor that outputs the magnetic signal response. The same dominant ferrous object is located horizontally by solving the quadratic equation ($0=(P_r-P_l)r^2-2wP_r r+P_r w^2$) for horizontal distance "r," which represents horizontal distance from the ferrous object to the magnetic sensor outputting the magnetic response. Solving the quadratic equation uses the $1/r^2$ formulation to model the magnetic strength of the dominant object as a function of distance from the magnetic sensor. If more than one ferrous object is identified as possibly being a dominant ferrous object, then the effects of the larger disturbances (larger outputted magnetic signals) are distinguished from each identified object using the $1/r^2$ model. That is, all the detected objects that are potential dominant ferrous objects are located horizontally and vertically. Minor adjustments to the vertical position are done based on the relative strengths of the magnetic signals outputted from adjacent sensors.

A summary of these methods follows:

A) Raw magnetic data is obtained from magnetic sensors as magnetic gradient v. time.

B) Each sensor within the portal is analyzed individually.
  1) "features" needed for detection and classification are extracted.

C) Composite portal data is analyzed for the presence of "objects."
  1) maximum signal power in individual time domain traces used as first indication of vertical location of object(s).
  2) dominant object (largest disturbance) horizontally located using the $1/r^2$ model.
  3) multiple objects in close proximity are "de-convoluted" using the $1/r^2$ model.
  4) horizontal location of multiple objects is determined by the same $1/r^2$ model.
  5) front/back location of objects, relative a person, is determined by the dimensionless ratio of the point in time of occurrence of the maximum peak signal relative (over or within) the entire time frame of the time trace used during the measurement event.
  6) vertical location of objects is adjusted based on adjacent sensor outputs.

D) Analysis and reporting of precise magnetic field strength and location of the object is conducted.

It should be understood that the raw magnetic data is representative of the Earth's magnetic field, which can be visualized as laterally spaced, generally parallel, and uniform lines of force called "magnetic field lines." The density or magnetic flux of the magnetic field lines determines the strength of the magnetic field. When the Earth's uniform magnetic field is disturbed by the passage of a magnetic conductive material such as a ferrous object, the magnetic field lines are concentrated or channeled, which induces a dipole moment having a north/south pole.

Additionally, it must be understood that ferrous objects comprised of ferromagnetic materials have a positive and negative magnetic pole. As discussed previously, for long and slender ferrous objects, the magnetic poles are separated sufficiently wherein both poles are detected by magnetic sensors during the measurement event. The detection of both poles is the classic magnetic dipole response or signature. However, for small and compact ferrous objects, the magnetic poles are close together wherein generally only one of the two magnetic poles is detected, that is, the stronger of the two magnetic poles is detected or sensed which results in the magnetic monopole response or signature.

It should be remembered that the magnetic dipole response is graphically represented with a crossover or inflection point of the magnetic responses wherein the magnetic poles switch polarity. It should be remembered that vertical locations of objects strongly correlate to the crossover or inflection point of the magnetic responses. Furthermore, it should be remembered that the magnetic signal peaks of the magnetic dipole decrease significantly with increasing distance from the magnetic sensors, and that decrease is represented as a rate of $1/r^2$. Additionally, the width of the magnetic response widens with increasing distance from the magnetic sensors.

It should be understood that the composite or alloy of a ferrous object (e.g., a handgun) affects the amplitude of the magnetic dipole response. In fact, different types of handguns can be distinguished from one another based on the differing composites and differing amounts of ferromagnetic material contained in each handgun. The more massive the ferromagnetic material in the handgun, the greater the amplitude and width of the magnetic response representing the handgun. It should be remembered that a width of the magnetic signal is a function of the number of adjacent sensors that sense or detect the same item or ferrous object during the measurement event.

It should be further remembered that determining the position of the ferrous object within the portal passageway requires the analytical analysis of relationships between the various parameters of the magnetic signals, for example: peak amplitude, peak location and inflection points in the magnetic response. The position of the object is further validated by comparing responses of adjacent and opposite sensor pairs.

As previously discussed, the amplitude of the measured magnetic signal decreases with increasing distance from the magnetic sensor. There are two physical mechanisms that produce signals: magnetization of the object and distortions in the Earth's magnetic field due to the ferrous mass of the object. Since both mechanisms can be present at varying magnitudes, a single theoretical signal decay function is incapable of predicting the amplitude of the magnetic signal for a given magnetic target (ferrous object) at a given location. Similarly, because a magnetic target may provide a simple and/or small dipole, or a larger more complex magnetic structure (e.g., quadrupole), then a viable theoretical model for all real-world target objects would have to be very complex.

Accordingly, the inventors of this application implemented techniques to properly describe a magnetic signal decay function for the desired targets. However, before the signal decay function could be determined, several conditions had to be taken into consideration:

1) The objects in the target set or class are complicated assemblies containing many parts of different materials that result in complex magnetic structures, that is, the target classes do not have simple dipole magnetic structures;
2) Due to the complicated construction of the objects, the objects do not behave as point sources of magnetism (especially when close to the sensors);
3) Due to the complex magnetic structures and complicated construction of the objects, the geometric center of the object is not necessarily the center of the magnetic moment for the target; and
4) Magnetic permeability effects (that is, distortion of the Earth's magnetic field) and apparent target magnetization vary greatly for each object depending on orientation relative to the sensors.

These conditions greatly affect the repeatability of any magnetic signal collected from locations very close to the magnetic sensors, which, logically, is important to understand for the pattern classification methods. In addition, for targets with small magnetic signal variations in the noise floor, the magnetic signals can be on the order of the signal amplitude of the ferrous object. These situations greatly affect the repeatability of any magnetic signal collected from locations very far from the magnetic sensors. These conditions for magnetic signal repeatability can generate significant difficulties when trying to accurately characterize the signal decay function of each ferrous object.

Figures 15, 15A:
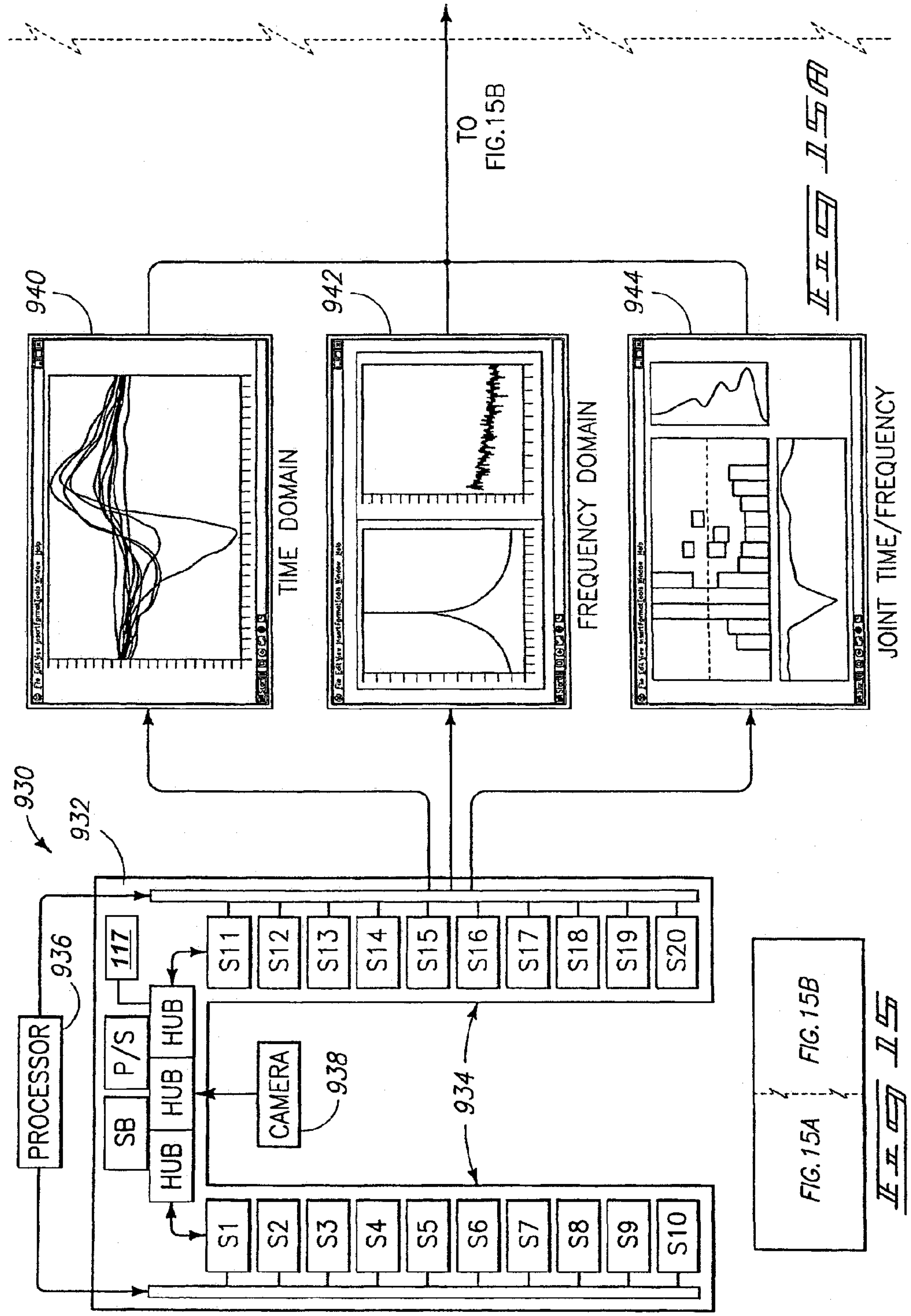
FIGS. 15A and 15B illustrate an exemplary system level diagram representing interdependency of the various embodiments of classification analysis methods that culminate in a classification result for an exemplary embodiment of a pattern classification method according to one of various embodiments of the present invention.
Figure 15B:
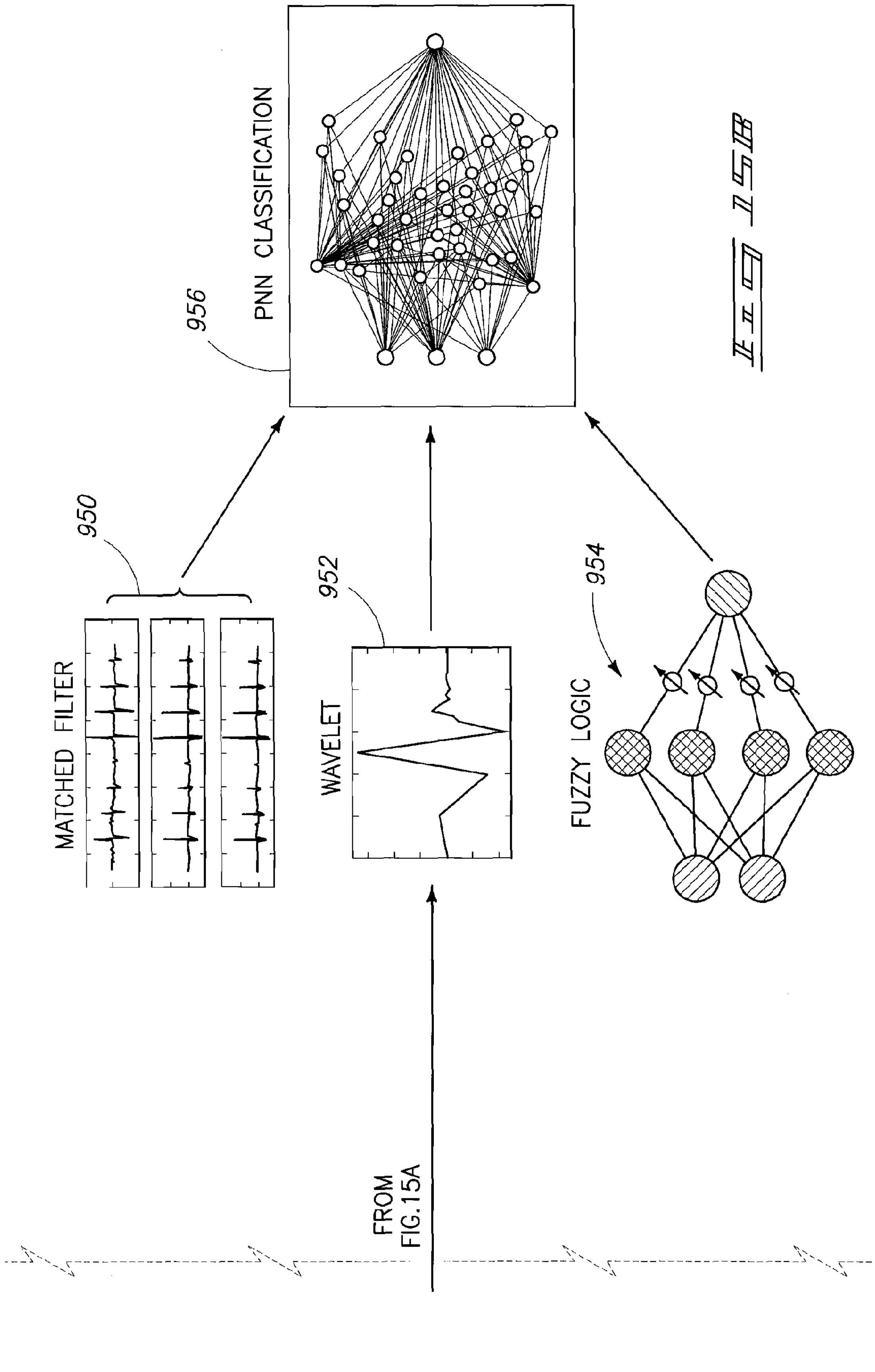

Accordingly, in one embodiment of the invention, a pattern classification method uses a fusion of classification analytical methods to improve the signal-to-noise performance of magnetic sensors and to extract unique spectral features. Specific classification analysis methods include: wavelets, matched filters and model-based frequency analysis. FIG. 14 illustrates a block diagram representing the interdependency of the various embodiments of classification analysis methods that culminate in a classification result for an exemplary embodiment of the pattern classification method according to an embodiment invention. FIGS. 15A and 15B illustrate a system level diagram representing the interdependency of the various embodiments of classification analysis methods that culminate in a classification result for an exemplary embodiment of the pattern classification method according to an embodiment invention. FIGS. 14, 15A and 15B will be more thoroughly described subsequently. However, first the various embodiments of the classification analysis methods are described.

One exemplary embodiment of a classification analysis method according to the invention is a wavelet method. The wavelet method provides the means to extract secondary or complex dipole moments. The exemplary wavelet method allows the simultaneous extraction of both low-frequency and high-frequency magnetic signals having different frequency resolutions. Additionally, the wavelet method preserves the timing information (time domain) of the magnetic signal that other data analysis methods fail to maintain. The wavelet method is dependent upon deriving a waveform transform that best matches the magnetic signal characteristics of the object being analyzed (for example, a gun). The wavelet method is not limited to a sinusoidal function. The function of the wavelet method provides a "best fit" of the wavelet to the pertinent portions of the magnetic signature waveform. The fundamental wavelet transform function is understood by those skilled in the art and defines the theoretical basis for deriving mother wavelets, which will be used for feature extraction from magnetic signals.

Wavelets derived from the wavelet method are well-suited for the analysis of predominately non-stationary magnetic signals that have sudden spikes or peak values and a transient existence. The wavelet method uses wavelets for feature extraction. That is, the numerical implementation of the wavelet transform is a filter bank designed for processing of magnetic signals that have a short duration (transient). The wavelet transform uses a correlation operation to compare real-time signals to an elementary function. The wavelet transform compares the magnetic response signal to a predefined set of short waveforms called the fundamental wavelet (or mother wavelet). The wavelets have different time durations, or scales, that mathematically represent impulse-like functions. This enables near real-time processing of impulse signals, such as magnetic signals representing complex dipole moments of a gun.

The wavelet transforms of the wavelet method indicate the frequency of the magnetic signal and indicate the timing of when the frequency occurs. That is, the wavelet method applies wavelets to characterize a magnetic signature simultaneously in both the time and frequency domains. Accordingly, the wavelets are used to:

1. Detect unique magnetic signal responses, such as a magnetic dipole crossover or inflection point, which is often representative of a gun;
2. Remove undesirable trends from the signal, such as ramping DC offset; and
3. Suppress random, but well-characterized, magnetic noise sources, such as monorail electromagnetic interference.

During an exemplary measurement event by a security screening system, the magnetic sensors are modulated, which introduce detrimental noise artifacts in the sensor response signal. The wavelet transforms are used to improve the magnetic sensor signal-to-noise ratio. For example, in one embodiment of the wavelet method, the process includes: a) taking the wavelet transform of the magnetic baseline signal of the magnetic sensors by applying the wavelet function to smooth out or negate undesirable spikes and drifts in the signal; and b) inverting the wavelet transform to reconstruct the original magnetic signal minus the noise. Performing the wavelet transformation to decompose the magnetic signal provides a set of wavelet coefficients. These wavelet coefficients represent characteristics of the original magnetic signal. The wavelet coefficients having a magnitude below a chosen threshold value are set to zero. The threshold value for the wavelet coefficients will ideally represent the magnetic noise to be removed. After setting the wavelet coefficients that are below the threshold value to zero, an inverse wavelet transform is performed to provide the magnetic signal without the magnetic noise.

In another embodiment of the invention, the wavelet method is employed to selectively discard undesired components, such as far-field noise and sensor thermal drift trends, which may corrupt the original magnetic signal. A drift in the magnetic sensor's DC offset can mask other important magnetic signal features. The trend often appears as a strong DC component in the frequency spectrum. Typical detrending techniques use low-pass filters, which can also impact or alter desired signal features. However, wavelet-based detrending will preserve the important features of the original signal.

It has been demonstrated that various objects (guns, cell phones, etc.) generate a unique magnetic signature or response. The uniqueness is not readily apparent with analysis methods that use only one basis function (complex sinusoidal). The wavelet method will reduce to practice a series of "mother wavelets" that are tailored to match the magnetic signals of interest.

In real-time, the magnetic signature of a ferrous object is acquired, such as, during the period of time a person is walking through the portal passageway 106 of system 100 with a gun. Multiple waveform transforms of the magnetic signature are performed to match the response to a known threat, that is, a known magnetic waveform that represents a known ferrous object, either non-threatening or threatening. For example, the potential exists to derive a series of mother wavelet functions for magnetic waveforms, each approximating the magnetic response from different classes of ferrous objects including cell phones, PDAs, cameras, underwire bras and steel shank shoes. Each one of these classes would be considered non-threatening ferrous objects.

Another exemplary embodiment of a classification analysis method according to the invention comprises a matched filter method. The matched filter method provides the means to filter out typical "false alarm" noise responses by processing the measured spatial data and identifying magnetic dipolar responses. The results are compared to modeled magnetic data. The fundamental matched filter correlation function is understood by those skilled in the art and serves as the basis for deriving application-specific matched filters. A matched filter can be used in communications to "match" a particular transit magnetic waveform to achieve the maximum signal-to-noise ratio (SNR) and to emphasize certain signal bands where high-fidelity information is present while de-emphasizing regions that are more prone to noise corruption. In contrast, the matched filter method relies on a matched filter correlation function to process concealed weapon spatial data and identify magnetic dipolar responses.

The identification of magnetic dipolar responses is accomplished by comparing model magnetic data generated through a training process to real-time field magnetic data. The resulting (or measured real-time) field magnetic data includes parameters such as spatial location, dipole strength, and orientation. When an optimum match is found in the comparison, the above parameters are stored in a computer memory. The measured parameters are then compared to modeled parameters that are expected for indicating a weapon or threatening ferrous object. The inventors of this application established parameters and features of known weapons from testing under standardized conditions. This comparison analysis provides a means for filtering out superfluous magnetic responses acquired during a measurement event, such as the magnetic responses outputted as the result of metallic clutter and environmental conditions.

Another exemplary embodiment of a classification analysis method according to the invention is a model-based frequency analysis method (super-resolution). Magnetic responses for objects having minimal ferromagnetic material can include a time-dependent spectra that is mainly a DC component. To extract out other frequency components, additional preprocessing is required. Accordingly, it is proposed that some important features of the magnetic response are not evident in the time waveform of the magnetic signal. Analyses of magnetic sensor responses to concealed weapons show that the frequency response is near DC, with features clustered in bins as close as 0.02 Hz. Therefore, the resolution of this frequency response is difficult to resolve and acquire the important features of the magnetic responses for additional processing and/or analysis.

The model-based frequency analysis method is a model-based analysis technique to improve resolution, and includes using the following various methods: matrix pencil, covariance, Prony's, and principle component auto-regressive (PCAR). In one embodiment according to the invention, the frequency analysis method is based on the "matrix pencil" method. Using the matrix pencil method, the magnetic response will be modeled as a time series and approximated with a recursive difference equation. For example, published Spectral Analysis Algorithms are used incorporating the matrix pencil method and understood by those skilled in the art. That is, exemplary mathematical equations and derivatives of the matrix pencil method are understood by those skilled in the art. Using the matrix pencil method in this manner will quantify the resonance frequency and the primary frequencies where the power of the magnetic signal resides. Moreover, the matrix pencil method will be optimized to obtain super-resolution power spectra, even when only small magnetic data sets are available.

In other embodiments of the invention, methods were developed for analyzing and compensating for narrowband signals whose frequencies change slowly with time. Magnetic responses of this type include slowly varying background conditions from diurnal effects, solar storms, or drift in the sensor's DC offset. For example, raw magnetic sensor data is collected in the time domain. Different ferrous objects provide the unique waveforms that are useful for pattern classification. The raw magnetic data is analyzed to determine statistical relationships, such as standard deviation and mean, and made available for pattern classification.

Referring to FIG. 14, an exemplary pattern classification method 900 is described according to one of various embodiments of the invention. The pattern classification method 900 incorporates several classification analysis methods to analyze the raw magnetic data, the several classification analysis methods including: a) the matched filter 902; b) the frequency analysis 904; c) time-based features 906; and d) wavelet analysis 908. The pattern classification method 900 validates the various classification analysis methods through a logical comparison of the respective independent conclusions or determinations provided by each of the classification analysis methods. In one exemplary embodiment of the pattern classification method 900 according to the invention, the validation is performed using digital logic. In one exemplary embodiment of the pattern classification method 900, the validation is performed through Boolean logic with associated rules. In another exemplary embodiment of the pattern classification method 900, the validation is performed through the use of fuzzy logic rules 910 (also referred to as "fuzzy logic" 910).

Fuzzy logic 910 is a problem-solving control system methodology and is implemented, for example, by software. Fuzzy logic 910 provides a simple way to arrive at a definite conclusion based upon sometimes vague, ambiguous, imprecise, noisy, or missing input information. Fuzzy logic 910 methodology is an approach to control problems by mimicking how a person would make decisions, only much faster. Fuzzy logic 910 incorporates a simple, rule-based, IF X AND Y THEN Z, approach to solving a control problem rather than attempting to model a system mathematically. The fuzzy logic 910 model is empirically based, relying on historical knowledge and experience. Because of the rule-based operation, any reasonable number of inputs can be processed by the methodology of fuzzy logic, for example, a range of one input to eight or more inputs can be handled. Fuzzy logic 910 can process nonlinear systems that would be difficult or impossible to model mathematically.

An exemplary fuzzy logic 910 explores relationships between multiple data inputs to reach empirical conclusions. The fuzzy logic 910 methodology is tailored to mimic human logic and experience acquired from operation of exemplary testbeds operated by the inventors. For example, in one embodiment, fuzzy logic 910 is used to assign different weights to features based on location of the ferrous object and magnitude of the magnetic response. Fuzzy logic 910 is also used to weigh the confidence level of the classification decision. For instance, if multiple ferrous objects are detected within a clustered region, the confidence level would be decreased.

Still referring to FIG. 14, after validation by the fuzzy logic 910 of all the inputs from the extraction and analysis methods, the empirical conclusions are inputted from fuzzy logic 910 to a neural network 912 for further processing. The following summarizes the inputs for driving pattern recognition methods to obtain classifications 914 results of the pattern classification method 900. Each of the below magnetic field data features or characteristics are assigned weight values by the neural network 912. The neural network 912 compares the real-time magnetic signature features to a prior trained database of known magnetic signature features.

Referring to FIGS. 15A and 15B, such figures illustrate a system level diagram of the exemplary pattern classification method 900 just described. Referring to FIG. 15A, security screening system 930 incorporates an array of magnetic sensors or gradiometers (magnetic sensor boards) arranged in a portal structure or frame 932 to form a screening region therein. It should be understood that security screening system 100 (FIG. 1), previously described, is interchangeable with security screening system 930, and vice versa, including the different structures or components shown and described between the two systems 100, 930. An exemplary portal structure 932 defines a passageway or gateway (doorway) 934 having an entrance and an exit configured for allowing items and persons to pass through for inspection.

In one embodiment of the security screening system 930 according to the invention, a camera 938 is electrically coupled to circuitry and processors of security screening system 930. Camera 938 is secured to portal structure 932 on a swivel mechanism (not shown) according to one of various embodiments of the invention. In another embodiment of the security screening system 930, trigger device 117 is provided to indicate when an individual or person is approaching portal structure 932, passing through portal structure 932, and exiting portal structure 932. Accordingly, trigger device 117 provides the capability to initiate activation of camera 938 (and magnetic data processing). An exemplary trigger device 117 includes an infrared break beam sensor or photo-detector. The swivel provides the capability for camera 938 to take real-time snapshot images of an individual approaching security screening system 930, passing through security screening system 930, and exiting security screening system 930.

Still referring to FIG. 15A, opposite vertical portions of the exemplary portal frame 932 house respective arrays of gradiometers or magnetic sensor boards S1-S20. Each exemplary magnetic sensor board S1-S20 extends in an exemplary vertical orientation and comprises the gradiometer configuration with magnetoresistive (MR) sensors. Exemplary electrical power of 110VAC is provided from an exemplary facility, such as an airport (not shown), to magnetic sensor boards S1-S20 via a power supply, hub and power bus combination. It should be understood that according to exemplary embodiments of the invention, the array of magnetic sensor boards S1-S20 can be arranged in any of a wide variety of configurations to define a screening region. For example, magnetic sensor boards can be provided in an upper portion of portal structure 932 to extend generally horizontally, and/or in floor portions that support the portal structure 932 and to extend again in generally a horizontal orientation. Magnetic sensors S1-S20 in respective opposite vertical portions of portal structure 932 are coupled separately and discretely to a processor 936 or microprocessor via the power bus. An exemplary processor is a digital signal processor (DSP). The separate and discrete circuitry allows for separate and distinct signals that are specifically tailored for and provided to the respective magnetic sensors S1-S20.

Still referring to FIG. 15A, raw magnetic data is outputted from respective magnetic sensors S1-S20 wherein the raw magnetic data is analyzed in a time domain 940, a frequency domain 942, and a joint time and frequency domain 944.

Referring to FIG. 15B, a plurality of exemplary methods that analyze the magnetic data include a matched filter method 950, a wavelet method 952, and a fuzzy logic method 954, and another method described throughout this document (and described as "inputs" below). Respective computation (or final) values from all the methods are provided to a probability neural network 956 (interchangeable with neural network 912 of FIG. 14) for further processing and analysis (described subsequently) to reach a classification conclusion (interchangeable with classifications 914 of FIG. 14). Accordingly to one embodiment of the invention, an exemplary classification is computed by a probability neural network 956 (PNN).

According to one of various embodiments of the invention, inputs from the variously described methods are provided to neural networks 912 and 956 for further processing and described below:

1) Raw magnetic sensor data reduction method using signed minimum/maximum function: This method reduces raw magnetic sensor data to a single point per magnetic sensor. Each magnetic sensor in the portal passageway is continuously sampled at operator selectable data rates, for example, 1 kHz. The magnetic data is filtered, averaged, and baseline corrected. This data reduction method is implemented on the sensor-level digital signal processor.

2) Magnetic moment classification:

a) Classification is based on an overall portal summation of the reduced data sets. This results in a spectral waveform that has as many data points as portal sensors. Based on respective peaks and valleys a magnetic moment classification is made. Due to complex magnetic structures/properties of ferrous items, different magnetic moments are induced: monopole, dipole, and quadrupole. A classic dipole response is indicative of large slender objects. However, on small, compact objects, the poles are close together and, generally, the stronger of the two poles is sensed, resulting in a monopole magnetic signature. The theory is that the derived classification provides an indicator of the class of potential threats.

b) As noted prior, implementation of this method requires a complete portal spectral waveform and therefore is processed at the portal computer level. Other embodiments of this method are also possible at the sensor-level digital signal processor by analyzing the peak/valley responses of each individual magnetic sensor.

3) X, Y position of detected ferrous object: Vertical location of the object strongly correlates to the crossover or inflection point of the magnetic moment response. The derived vertical position of the inflection point is fed into the neural network 912. This method requires a complete portal spectral waveform and therefore is processed at the portal computer level.

4) Time domain analysis of the raw spectral waveform from each sensor: The number of peaks, individual and relative peak amplitudes, peak widths, and peak rise and fall times are calculated and fed to the neural network 912. The peaks of the magnetic moments decrease significantly with increasing distance from the sensors. Theoretical peak response should decrease at $1/r^2$. The width of the response widens with increasing distance from the sensors. The composite or alloy of handguns affects the amplitudes of the magnetic responses. Types of handguns can be discriminated based on the mass of ferromagnetic material contained in respective handguns. The more mass, the higher the amplitude of the response. Response width is a function of the number of adjacent sensors that detect or sense the same ferrous object. The method is implemented through a time domain analysis performed by the sensor-level digital signal processor.

5) Frequency domain analysis of the raw spectral waveform from each sensor: Fast Fourier Transform (FFT) functions are used to calculate the primary frequency components and power content of the magnetic spectra. The power spectrum of the magnetic sensor data is also calculated by squaring the magnitude of the Fast Fourier Transform of the signal. Both inputs are fed to the neural network 912. The method is implemented through a frequency domain analysis performed by the sensor-level digital signal processor.

6) Z-axis, Time-positioned data analysis: This function determines whether the target is located in front of a body (F) or at the back of a body (B). A two-state position flag (F, B) is passed into the neural network. This method is implemented through synchronizing data to a start and stop break beam and calculating the total elapsed time between start/stop pulses. The elapse time is used to calculate the walking speed of an individual passing through the portal passageway of, for example, security screening systems 100 and 930. The elapse window is divided into segments, representing a person entering the portal, the person directly within portal, and the person exiting the portal. The occurrence of the major magnetic peak versus time is correlated to when it occurred within the sampling (time) window allowing a best-fit assignment to the front or back. This information is very pertinent in the discrimination of chest region alarms, such as underwire bras. In one exemplary embodiment of the invention, this method is implemented through time domain analysis and synchronization with the infrared break beam.

7) Portal zone where alarm occurred:

a) Zone positions of potential threats include the feet, legs, waist, mid-body, and head. The opening of the portal passageway, for example, security screening system 100 and 930, is divided into regions of interest. If an alarm occurs in the area of the feet (as identified by the X, Y position detection method above), then a pattern classification database that is specific to threats and non-threats commonly occurring in that region (i.e., at the feet) is processed. For instance, the real-time magnetic spectra would be compared to a historical spectra including features such as steel shank shoes. In contrast, the real-time magnetic spectra would not be compared to a historical spectra that includes underwire bras because, logically, a bra would not be located in the feet region. This allows databases to be reduced in size and simplifies the amount of potential solutions the neural network has to analyze.

b) For one embodiment of the invention, methods were implemented using a statistical average height dimension for a male: 5 feet, 10 inches. However, other exemplary embodiments of the invention include using an analysis of a real-time snapshot image of the individual obtained by, for example, a camera 938 of security screening system 930. Actual height and width can be extrapolated from the snapshot image. Another exemplary embodiment of the invention is the use of other sensor technology, such as an infrared-light curtain or ultrasonic sensors, to determine a height of an individual. In one exemplary embodiment of the invention, this method is implemented on a computer system supported on or proximate the portal structure.

8) Post-processing JTFA analysis of raw sensor data: A more advanced joint time-frequency analysis (JTFA) method is used to extract unique features from the raw magnetic data. It is noted that the standard FFT provides the average frequency content of the magnetic signal over the entire time that the magnetic signal is acquired. That method is more accurate for stationary magnetic signal analysis. For measuring frequency information that may be changing during acquisition, the joint time-frequency analysis is used. The JTFA method is used to calculate the instantaneous power spectrum and to extract the specific frequencies of the major peak. This information is also provided to the neural network 912. In one exemplary embodiment of the invention, this method is implemented using a National Instruments utility and executes under LABVIEW™ on the computer system supported on or proximate the portal structure.

9) Symmetry fitness calculations: Objects such as shoe shanks and underwire bras each have a symmetrical magnetic signature or fingerprint. Moreover, the opposite and adjacent magnetic sensors located in the portal structure will detect and output a similar magnetic response for each object. For one exemplary embodiment of the invention, adjacent magnetic sensors are compared to determine if magnetic signatures being detected are statistically equivalent. For another exemplary embodiment of the invention, opposite magnetic sensors are compared to determine if magnetic signatures being detected are statistically equivalent.

10) Gun coefficient analysis: It has been noted that complex dipole objects, such as guns, induce a unique magnetic moment with multiple inflection points. This property can be used as an indicator of potential threat items.

For one exemplary embodiment of the invention, a neural network is implemented for training data representative of ferrous objects, and therefore, a general discussion on neural network theory is warranted. The training data includes many sets of input variables and a corresponding output variable. In statistical terms, the inputs are called independent variables and the output variable is called the dependent variable (represented as classifications 914 in FIG. 14 and PNN classification 956 in FIG. 15B). Each set of corresponding independent variables and dependent variable is called an observation.

The neural network begins by finding linear relationships between the inputs and the output. Weight values are assigned to the links between the input and output neurons. After those relationships are found, neurons are added to the hidden layer so that nonlinear relationships can be found. Input values in the first layer are multiplied by the weights and passed to the second (hidden) layer. Neurons in the hidden layer "fire" or produce outputs that are based upon the sum of weighted values passed to them. The hidden layer passes values to the output layer in the same fashion, and the output layer produces the desired results, for example, classifications 914 and 956 for FIGS. 14 and 15B, respectively.

The network "learns" by adjusting the interconnection weights between layers. The answers the network is producing are repeatedly compared with the correct answers, and each time, the connecting weights are adjusted slightly in the direction of the correct answers. Additional hidden neurons are added as necessary to capture features in the data set.

Eventually, if the problem can be learned, a stable set of weights evolves and will produce good answers for all of the sample decisions or classifications. The real power of neural networks is evident when the trained network is able to produce good results for data which the neural network has never "seen" or handled previously.

Figure 16:
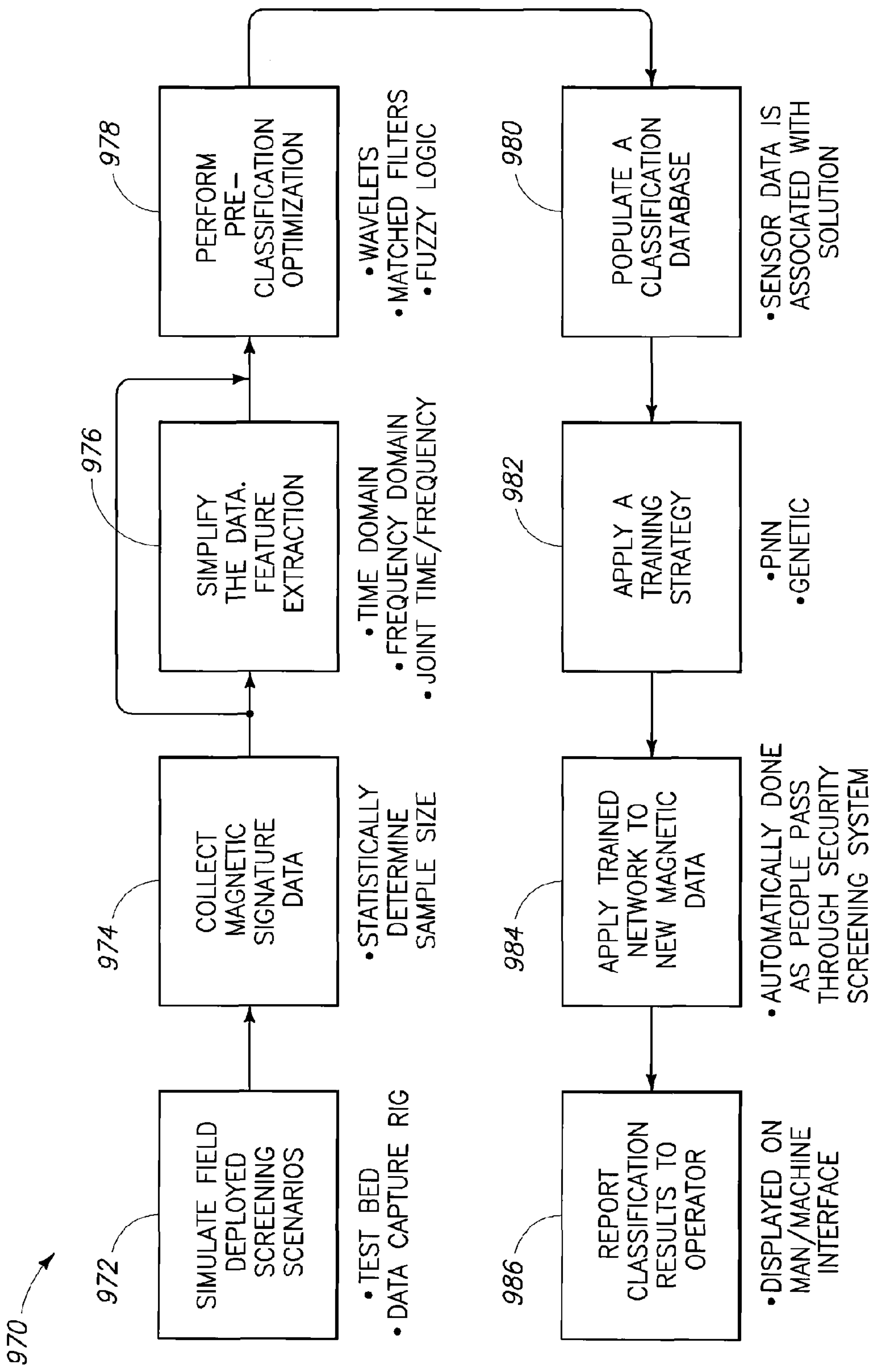
FIG. 16 illustrates an exemplary process flow performed in developing an exemplary neural network database and classification function according to one of various embodiments of the present invention.

For an exemplary embodiment of the invention, the following procedures are performed in developing a neural network database and classification function. Referring to FIG. 16, an exemplary process flow 970 according to one of various embodiments of the invention is described.

Exemplary step 972, simulate field deployed screening scenarios. Step 972 includes simulating real-world conditions in a laboratory environment. Various threatening and non-threatening items are introduced to an exemplary portal of an exemplary security screening system, such as system 100 described above. Step 972 includes testbeds and data capture rigs.

Exemplary step 974, collect magnetic signature data. Step 974 includes developing a library of magnetic spectra of signature data or features for threatening and non-threatening items, and saving the library of magnetic spectra in a memory file. An exemplary memory file is a comma-delimited text file. Step 974 includes statistically determining sample size.

Exemplary step 976, simplify the magnetic data and extract features from the magnetic data. Step 976 includes at least the following exemplary methods to extract features: the time domain method, the frequency domain method and the joint time/frequency method, all of which are described above. In one exemplary embodiment of the exemplary process flow 970 according to the invention, step 976 is optional, wherein process flow 970 moves from step 974 to step 978.

Exemplary step 978, perform pre-classification optimization. Step 978 includes at least the following exemplary methods to perform pre-classification optimization: the wavelet method, the matched filters method and the fuzzy logic method, all of which are described above.

Exemplary step 980, populate a classification database. Step 980 includes sensor data being associated with a solution(s).

Exemplary step 982, apply a training strategy. Step 982 includes configuring a Neural Network Training Strategy. In one of the various embodiments of configuring a Neural Network Training Strategy, such an embodiment includes selecting a Neural Network method such as probabilistic (PNN) or genetic. Step 982 further includes defining a maximum number of hidden neurons to avoid over-fitting the model. Step 982 still further includes configuring user-defined Fitness Coefficients by assigning weights to inputs based on relevance.

An exemplary sub-step of step 982 includes a Training Mode or training process. The training mode includes initiating software utilities to derive a classification function (Neural Network training mode). The training mode includes monitoring reports of percentage correct classifications versus increasing a number of iterations. The training mode further includes monitoring reports of significance of each input in predicting the output value. The training mode is stopped or discontinued when acceptable confidence limits are achieved.

Another exemplary sub-step of step 982 includes a Test Mode. The test mode includes validating the trained data by applying to an out-of-sample test database. The test mode includes reviewing probabilities of classification. The test mode further includes monitoring reports of an "Agreement Matrix," that is, true positive, false positive, true negative and false negative. The test mode still further includes reviewing the ROC Curve.

The exemplary step 982 further includes saving the Neural Network database and classifications function (Network). Saving the Network includes saving the trained and validated Network to a data file with .net extension.

The exemplary step 982 still further includes integrating the saved Network file into software onto a computer, for example, a Portal Control Computer. Integrating includes downloading network file(s) to the computer into a pre-assigned directory. Integrating further includes incorporating LABVIEW™ software to implement network files wherein LABVIEW™ software has a DLL that fires the neural network and applies it to real-time data. Outputs of the neural network are produced that comprise probabilities representing whether input pattern data (magnetic signature data) belong to a specific category of an item, such as a threatening item (gun) or a non-threatening item (cell phone).

Exemplary step 984, apply trained network to new magnetic data. Step 984 includes performing system level validation tests. For example, a person will walk through the portal of system 100 with various "trained" items. Step 984 further includes verifying proper classification of the various "trained" items.

Exemplary step 986, report classification results to an operator. An exemplary report includes displaying classification results on an interface.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method for determining a presence of a threatening object, the method comprising:

acquiring raw magnetic data associated with a magnetic response of a ferrous object within a detection range;

performing at least two different analysis methods independent from each other to extract a plurality of features from the raw magnetic data, wherein each individual feature of the plurality is a different repeatable characteristic that is characteristic to a same class of detectable ferrous objects, wherein at least one feature of the plurality is a symmetry coefficient representing symmetry of the ferrous object;

comparing the plurality of features with previously stored features from a database, the database having been populated with the previously stored features that are related to a variety of different known objects, wherein at least one of the variety of different known objects is classified as a non-threatening object and at least another of the variety of different known objects is classified as a threatening object;

determining that the ferrous object is a threatening object when the plurality of features extracted from the raw magnetic data are determined to at least substantially match the previously stored features of the threatening object; and determining that the ferrous object is a non-threatening object when the plurality of features extracted from the raw magnetic data are determined to at least substantially match the previously stored features of the non-threatening object.

2. The method of claim 1, wherein comparing the plurality of features with previously stored features includes comparing the plurality of features with previously stored features from a reduced set of a total number of known objects in the variety of different known objects when a particular feature is present that indicates a likelihood of a particular class of objects not to be present.

3. The method of claim 1, wherein performing at least two different analysis methods independent from each other to extract a plurality of features from the raw magnetic data includes performing a symmetry analysis including obtaining a ratio representing the symmetry coefficient, the ratio being obtained by comparing the raw magnetic data generated by opposing sensors among a plurality of sensors.

4. The method of claim 1, wherein performing at least two different analysis methods independent from each other to extract a plurality of features from the raw magnetic data includes obtaining a summary gradient value for each sensor among a plurality of sensors as at least one of the plurality of features.

5. The method of claim 1, wherein performing at least two different analysis methods independent from each other to extract a plurality of features from the raw magnetic data includes obtaining a total power value of a gradient signal detected by each sensor among a plurality of sensors as at least one of the plurality of features.

6. A method for determining a presence of a threatening object, the method comprising:

acquiring raw magnetic data associated with a magnetic response of a ferrous object within a detection range;

performing at least two different analysis methods independent from each other to extract a plurality of features from the raw magnetic data, wherein each individual feature of the plurality is a different repeatable characteristic that is characteristic to a same class of detectable ferrous objects, wherein performing at least two different analysis methods independent from each other to extract a plurality of features from the raw magnetic data includes obtaining a dimensionless ratio of time value as at least one of the plurality of features, wherein the dimensionless ratio of time value is obtained by measuring a time period window that each sensor among a plurality of sensors detects the ferrous object relative to an entire time period window;

comparing the plurality of features with previously stored features from a database, the database having been populated with the previously stored features that are related to a variety of different known objects, wherein at least one of the variety of different known objects is classified as a non-threatening object and at least another of the variety of different known objects is classified as a threatening object;

determining that the ferrous object is a threatening object when the plurality of features extracted from the raw magnetic data are determined to at least substantially match the previously stored features of the threatening object; and determining that the ferrous object is a non-threatening object when the plurality of features extracted from the raw magnetic data are determined to at least substantially match the previously stored features of the non-threatening object.

7. The method of claim 1, wherein performing at least two different analysis methods independent from each other to extract a plurality of features from the raw magnetic data includes obtaining a vertical position of the ferrous object as at least one feature of the plurality of features.

8. The method of claim 7, wherein obtaining a vertical position of the ferrous object includes determining an inflection point in the magnetic response of the raw magnetic data with the vertical position being defined at the inflection point.

9. The method of claim 1, wherein performing at least two different analysis methods independent from each other to extract a plurality of features from the raw magnetic data includes correlating the raw magnetic data with a wavelet waveform from the database of previously stored features, the wavelet waveform being related to one of a variety of different known objects.

10. The method of claim 1, wherein performing at least two different analysis methods independent from each other to extract a plurality of features from the raw magnetic data includes obtaining a gun coefficient value representing a presence of a gun that is based at least in part on a presence of a plurality of inflection points within the magnetic response of the raw magnetic data.

11. The method of claim 1, further comprising validating a conclusion of whether the ferrous object is one of a threatening object and a non-threatening object by providing the plurality of features extracted from the raw magnetic data as inputs to a neural network that validates the conclusion.

12. The method of claim 11, further comprising assigning different weights to at least two features of the plurality of features when the at least two features of the plurality of features are input into the neural network.

13. The method of claim 12, wherein assigning different weights to the at least two features of the plurality of features includes basing the different weights at least in part on a determined location of the ferrous object and a magnitude of the magnetic response of the raw magnetic data.

14. A security screening system, comprising:

a portal structure defining a passageway;

a plurality of magnetic sensors arranged within a first vertical portion and a second vertical portion of the portal structure, wherein each magnetic sensor of the plurality of magnetic sensors is configured to output raw magnetic data in response to detection of a ferrous object; and a processor coupled with the plurality of magnetic sensors, the processor further configured to:

extract at least two different features from the raw magnetic data received from the plurality of magnetic sensors using a plurality of different feature extraction analysis methods, wherein at least one feature includes a symmetry coefficient representing symmetry of the ferrous object;

compare the at least two different features extracted from the raw magnetic data with at least a plurality of known features for known objects, wherein the plurality of known features are stored in a database grouped in classes of at least one known non-threatening object and at least one known threatening object; and classify the ferrous object as representing one of a non-threatening object and a threatening object depending on which of the classes of the at least one known non-threatening object and the at least one known threatening object includes known features that are more similar to the at least two different features extracted from the raw magnetic data.

15. The security system of claim 14, wherein the at least two different features include at least one time domain characteristic of a magnetic response of the raw magnetic data, at least one frequency domain characteristic of the magnetic response of the raw magnetic data, and a determined physical location of the ferrous object within the passageway.

16. The security system of claim 15, wherein the at least one time domain characteristic is selected from the group consisting of a number of peaks in the magnetic response, a peak amplitude, a peak width, a peak rise time and a peak fall time.

17. The security system of claim 15, wherein the at least one frequency domain characteristic is selected from the group consisting of at least one frequency component of the magnetic response, and a power spectrum of the magnetic response.

18. The security system of claim 15, wherein the determined physical location of the ferrous object within the passageway is based at least in part on an inflection point of a magnetic moment response in the raw magnetic data.

19. The security system of claim 15, wherein the at least two different features further include a gun coefficient based at least in part on a presence of a plurality of inflection points in a magnetic moment response in the raw magnetic data.

20. A security screening system, comprising:

a portal structure defining a passageway;

a plurality of magnetic sensors arranged within a first vertical portion and a second vertical portion of the portal structure, wherein each magnetic sensor of the plurality of magnetic sensors is configured to output raw magnetic data in response to detection of a ferrous object; and a processor coupled with the plurality of magnetic sensors, the processor further configured to:

extract at least two different features from the raw magnetic data received from the plurality of magnetic sensors using a plurality of different feature extraction analysis methods, wherein the at least two different features further include a dimensionless ratio of an amount of time that the ferrous object is detected prior to the portal structure over an amount of time that a person transporting the ferrous object is determined to be within a measurement window of the portal structure;

compare the at least two different features extracted from the raw magnetic data with at least a plurality of known features for known objects, wherein the plurality of known features are stored in a database grouped in classes of at least one known non-threatening object and at least one known threatening object; and classify the ferrous object as representing one of a non-threatening object and a threatening object depending on which of the classes of the at least one known non-threatening object and the at least one known threatening object includes known features that are more similar to the at least two different features extracted from the raw magnetic data.

21. The security system of claim 15, wherein the processor is further configured to compare the at least two different features extracted from the raw magnetic data with at least a plurality of known features for a reduced set of the known objects stored in the database when the at least two different features include features that are not typical for a particular known object.

22. The security system of claim 15, further comprising a neural network configured to receive the at least two different features as inputs to the neural network, and further configured to validate a classification of the ferrous object as representing one of a non-threatening object and a threatening object.

23. The security system of claim 22, wherein the neural network is further configured to dynamically assign at least one among a plurality of weights to the at least two different features when validating the classification.

24. The security system of claim 14, wherein the processor is further configured to determine the symmetry coefficient by comparing the raw magnetic data generated by opposing sensors among the first vertical portion and the second vertical portion of the portal structure.

* * * * *

UNITED STATES PATENT AND TRADEMARK OFFICE

CERTIFICATE OF CORRECTION

PATENT NO. : 8,102,260 B2
APPLICATION NO. : 11/687725
DATED : January 24, 2012
INVENTOR(S) : Dale K. Kotter et al.

It is certified that error appears in the above-identified patent and that said Letters Patent is hereby corrected as shown below:

In the specification:

COLUMN 5, LINE 35, change “nanoTeslalmeter)” to --nanoTesla/meter)--

In the claims:

CLAIM 20, COLUMN 32, LINE 59, change “further include” to --include--

Signed and Sealed this
Twentieth Day of October, 2015

Michelle K. Lee
*Director of the United States Patent and Trademark Office*